(12) United States Patent
Liu et al.

(10) Patent No.: US 10,978,576 B2
(45) Date of Patent: Apr. 13, 2021

(54) TECHNIQUES FOR VERTICAL FET GATE LENGTH CONTROL

(71) Applicant: ELPIS TECHNOLOGIES INC., Ottawa (CA)

(72) Inventors: Chi-Chun Liu, Altamont, NY (US); Chun Wing Yeung, Niskayuna, NY (US); Robin Hsin Kuo Chao, Cohoes, NY (US); Zhenxing Bi, Niskayuna, NY (US); Kristin Schmidt, Mountain View, CA (US); Yann Mignot, Slingerlands, NY (US)

(73) Assignee: ELPIS TECHNOLOGIES INC., Ottawa (CA)

( * ) Notice: Subject to any disclaimer, the term of this patent is extended or adjusted under 35 U.S.C. 154(b) by 0 days.

(21) Appl. No.: 16/597,713

(22) Filed: Oct. 9, 2019

(65) Prior Publication Data

US 2020/0044055 A1 Feb. 6, 2020

Related U.S. Application Data

(62) Division of application No. 15/886,539, filed on Feb. 1, 2018, now Pat. No. 10,475,905.

(51) Int. Cl.
*H01L 29/66* (2006.01)
*H01L 21/311* (2006.01)
(Continued)

(52) U.S. Cl.
CPC .. *H01L 29/66666* (2013.01); *H01L 21/31058* (2013.01); *H01L 21/31133* (2013.01);
(Continued)

(58) Field of Classification Search
CPC .......... H01L 29/66666; H01L 29/7827; H01L 21/823487
See application file for complete search history.

(56) References Cited

U.S. PATENT DOCUMENTS 6,423,465 B1 7/2002 Hawker et al.
6,946,390 B2 9/2005 Schmidt
(Continued)

OTHER PUBLICATIONS

Mansky et al., "Controlling Polymer-Surface Interactions with Random Copolymer Brushes," Science, vol. 275, pp. 1458-1460 (Mar. 1997).
(Continued)

*Primary Examiner* — Mark V Prenty
(74) *Attorney, Agent, or Firm* — Shin Hung; VanTek IP LLP

(57) ABSTRACT

Techniques for VFET gate length control are provided. In one aspect, a method of forming a VFET device includes: patterning fins in a substrate; forming first polymer spacers alongside opposite sidewalls of the fins; forming second polymer spacers offset from the fins by the first polymer spacers; removing the first polymer spacers selective to the second polymer spacers; reflowing the second polymer spacers to close a gap to the fins; forming a cladding layer above the second polymer spacers; removing the second polymer spacers; forming gates along opposite sidewalls of the fins exposed in between the bottom spacers and the cladding layer, wherein the gates have a gate length Lg set by removal of the second polymer spacers; forming top spacers above the cladding layer; and forming top source and drains above the top spacers. A VFET device is also provided.

19 Claims, 18 Drawing Sheets

(51) Int. Cl.
  *H01L 29/40* (2006.01)
  *H01L 29/423* (2006.01)
  *H01L 21/3105* (2006.01)
  *H01L 29/78* (2006.01)

(52) U.S. Cl.
  CPC ...... *H01L 29/401* (2013.01); *H01L 29/42376* (2013.01); *H01L 29/6653* (2013.01); *H01L 29/6656* (2013.01); *H01L 29/66545* (2013.01); *H01L 29/7827* (2013.01); *H01L 21/31138* (2013.01)

(56) References Cited

U.S. PATENT DOCUMENTS

| | | |
|---|---|---|
| 8,815,747 B2 | 8/2014 | deVilliers et al. |
| 9,184,058 B2 | 11/2015 | Brown et al. |
| 9,418,848 B2 | 8/2016 | Brown et al. |
| 9,530,863 B1 | 12/2016 | Zhang et al. |
| 9,576,817 B1 | 2/2017 | Cheng et al. |
| 9,653,457 B2 | 5/2017 | Guo et al. |
| 9,685,537 B1 | 6/2017 | Xie et al. |
| 9,711,618 B1 | 7/2017 | Cheng et al. |
| 9,780,197 B1 | 10/2017 | Xie et al. |
| 9,972,494 B1 | 5/2018 | Bentley et al. |
| 10,217,672 B2 * | 2/2019 | Xie .................. H01L 27/092 |
| 10,475,905 B2 * | 11/2019 | Liu .................. H01L 21/31058 |
| 2015/0024597 A1 | 1/2015 | Gao et al. |
| 2018/0006118 A1 | 1/2018 | Mallela et al. |

OTHER PUBLICATIONS

Hagimoto et al., "Evaluation of the plasmaless gaseous etching process," Solid State Phenomena, vol. 134, pp. 7-10 (2008) (published Nov. 2007).

EESR dated Jan. 29, 2021, issued in respect of corresponding European Patent Application No. 19747021.4.

* cited by examiner

TECHNIQUES FOR VERTICAL FET GATE LENGTH CONTROL

CROSS-REFERENCE TO RELATED APPLICATIONS

This application is a divisional of U.S. application Ser. No. 15/886,539 filed on Feb. 1, 2018, the contents of which are incorporated by reference herein.

FIELD OF THE INVENTION

The present invention relates to vertical field-effect transistor (VFET) devices, and more particularly, to techniques for VFET gate length control using a material-based patterning method with self-limiting thickness control.

BACKGROUND OF THE INVENTION

As opposed to planar complementary metal oxide semiconductor (CMOS) devices, vertical field effect transistors (VFETs) are oriented with a vertical fin channel disposed on a bottom source and drain and a top source and drain disposed on the fin channel. VFETs are being explored as a viable device option for continued CMOS scaling beyond the 7 nanometer (nm) technology node.

With conventional process flows, the gate length (Lg) of a VFET is primarily controlled by two etch processes. The gate conductor is deposited conformally around the fin followed by (1) an OPL planarization and etch back process (to expose a top of the fin for the top source and drain), and (2) a wet gate metal etch. The gate length is mostly defined at this stage, but subsequent high-K dry etch and OPL ashing may also have very fine effects on the Lg as well. Such an etch-controlled gate length (Lg) is, however, subject to a large variation including within wafer, wafer-to-wafer, batch-to-batch, tool dependency, and pattern density (i.e., etch micro-loading) effect.

Therefore, VFET fabrication techniques that avoid the above-described etch related variations would be desirable.

SUMMARY OF THE INVENTION

The present invention provides techniques for vertical field-effect transistor (VFET) gate length control using a material-based patterning method with self-limiting thickness control. In one aspect of the invention, a method of forming a VFET device is provided. The method includes: patterning fins in a substrate; forming bottom source and drains at a base of the fins; forming bottom spacers on the bottom source and drains; forming first polymer spacers alongside opposite sidewalls of the fins, wherein the first polymer spacers include a monolayer of a first polymer brush material; forming second polymer spacers on the bottom source and drains offset from the fins by the first polymer spacers, wherein the second polymer spacers include a monolayer of a second polymer brush material that is un-grafted to the first polymer brush material; removing the first polymer spacers selective to the second polymer spacers creating a gap between the second polymer spacers and the fins; reflowing the second polymer spacers to close the gap; forming a cladding layer alongside the opposite sidewalls of the fins above the second polymer spacers; removing the second polymer spacers exposing the opposite sidewalls of the fins in between the bottom spacers and the cladding layer; forming gates along the opposite sidewalls of the fins exposed in between the bottom spacers and the cladding layer, wherein the gates have a gate length Lg set by removal of the second polymer spacers; forming top spacers above the cladding layer; and forming top source and drains above the top spacers.

In another aspect of the invention, a VFET device is provided. The VFET device includes: fins patterned in a substrate; bottom source and drains at a base of the fins; bottom spacers disposed on the bottom source and drains; a cladding layer disposed alongside opposite sidewalls of the fins; gates disposed along the opposite sidewalls of the fins in between the bottom spacers and the cladding layer, wherein the gates have a gate length Lg set by a distance between the bottom spacers and the cladding layer; top spacers disposed above the cladding layer; and top source and drains disposed above the top spacers.

A more complete understanding of the present invention, as well as further features and advantages of the present invention, will be obtained by reference to the following detailed description and drawings.

DETAILED DESCRIPTION OF PREFERRED EMBODIMENTS

As provided above, with vertical field-effect transistor (VFET) devices etch-controlled gate length (Lg) processes are subject to a large variation including within wafer, wafer-to-wafer, batch-to-batch, tool dependency, and pattern density (i.e., etch micro-loading) effect. Advantageously, provided herein are material-based patterning methods that are immune to these etch related variations.

Figure 1:
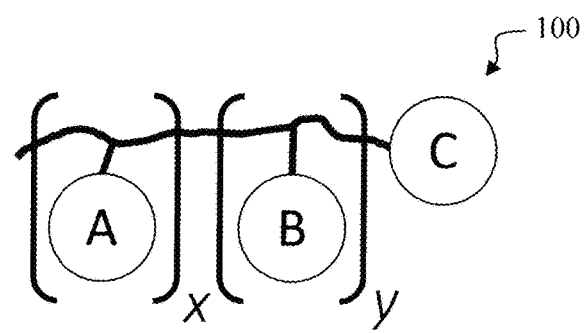
FIG. 1 is a schematic diagram illustrating a polymer brush according to an embodiment of the present invention.

Specifically, the present techniques leverage a polymer brush system with polymer brushes of self-limiting thicknesses to set the gate length (Lg), rather than etch-based processes. A polymer brush is a linear copolymer of one or more components plus a grafting functional group at one end. See, for example, Mansky et al., "Controlling Polymer-Surface Interactions with Random Copolymer Brushes," Science, vol. 275, pgs. 1458-1460 (March 1997) (hereinafter "Mansky"), the contents of which are incorporated by reference as if fully set forth herein. FIG. 1, for instance, depicts schematically a polymer brush 100. Polymer brush 100 is a linear copolymer having components A and B, as well as a grafting functional group C.

Figure 2:
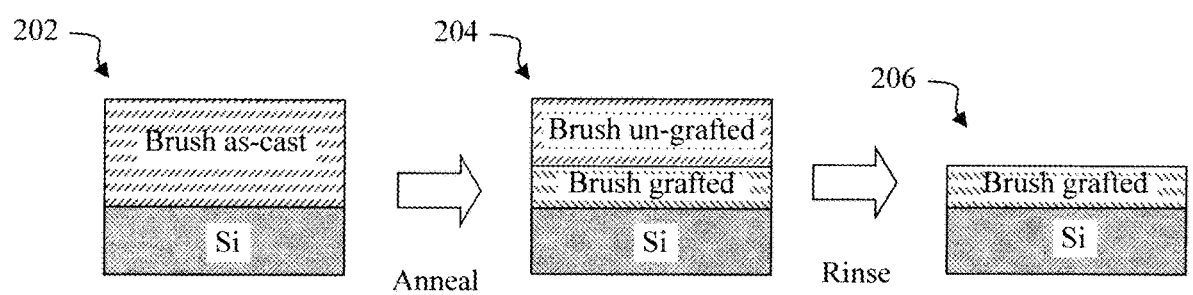
FIG. 2 is a diagram illustrating an exemplary methodology for grafting a monolayer of a polymer brush onto a surface according to an embodiment of the present invention.

Advantageously, only one monolayer of the polymer brush can be grafted onto a surface, thereby providing a self-limiting thickness on the surface. See, for example, FIG. 2. As shown in step 202 of FIG. 2, the polymer brush is cast onto a substrate (in this case a silicon (Si) substrate for illustrative purposes only). As shown in step 204, an anneal is used to graft a monolayer of the polymer brush ("Brush grafted") onto the substrate. According to an exemplary embodiment, the anneal is performed at a temperature of from about 25° C. to about 300° C., and ranges therebetween, wherein the lower bound is determined by the functional group, and the upper bound is determined by the polymer decomposition.

The un-grafted portion of the polymer brush is then rinsed away, leaving behind the monolayer of the polymer brush grafted to the substrate. See step 206. Suitable solvents for the rinse include, but are not limited to propylene glycol monomethyl ether acetate (PGMEA), toluene, benzene, xylene, tetrahydrofuran (THF), methyl isobutyl carbinol (MIBC), gamma-butyrolactone (GBA), and combinations thereof. As described in Mansky, the thickness of the polymer brush can be controlled based on the annealing time (duration) but will reach a self-limiting (saturated) thickness determined by the molecular weight of the brush. See, for example, FIG. 1 of Mansky.

As will be described in detail below, the present techniques employ different types of polymer brushes with different grafting groups having reactivity/selectivity to different surfaces. For instance, by way of example only, a first type of polymer brush material employed will be an organic brush material such as polystyrene (PS):

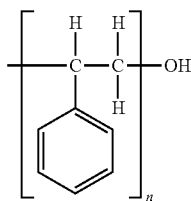

Another type of polymer brush material employed will be a Si-containing brush material ("Si brush material") such as polydimethylsiloxane (PDMS):

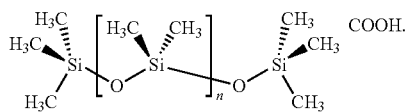

Processing temperature and grafting density will be chosen accordingly.

Figure 3:
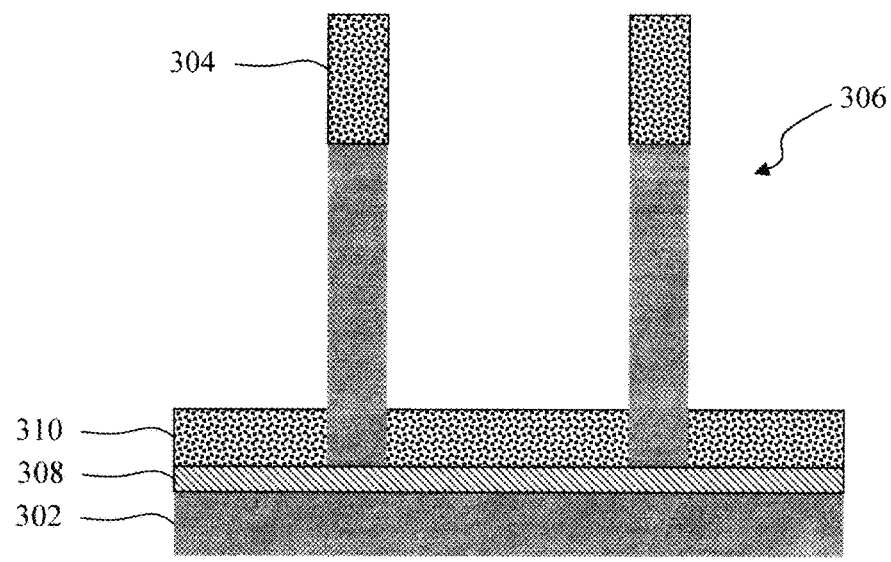
FIG. 3 is a cross-sectional diagram illustrating fin hardmasks having been used to pattern at least one fin in a substrate, bottom source and drains having been formed in the substrate at the base of the fins, and bottom spacers having been formed on the bottom source and drains according to an embodiment of the present invention.
Figure 4:
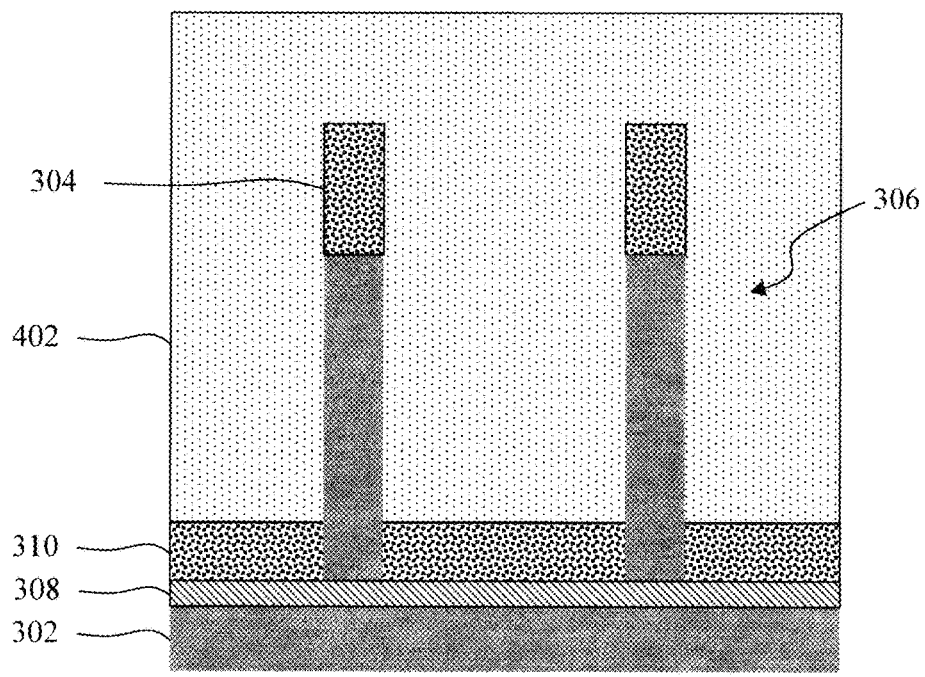
FIG. 4 is a cross-sectional diagram illustrating a first polymer brush material having been coated onto the fins and bottom spacers according to an embodiment of the present invention.
Figure 5:
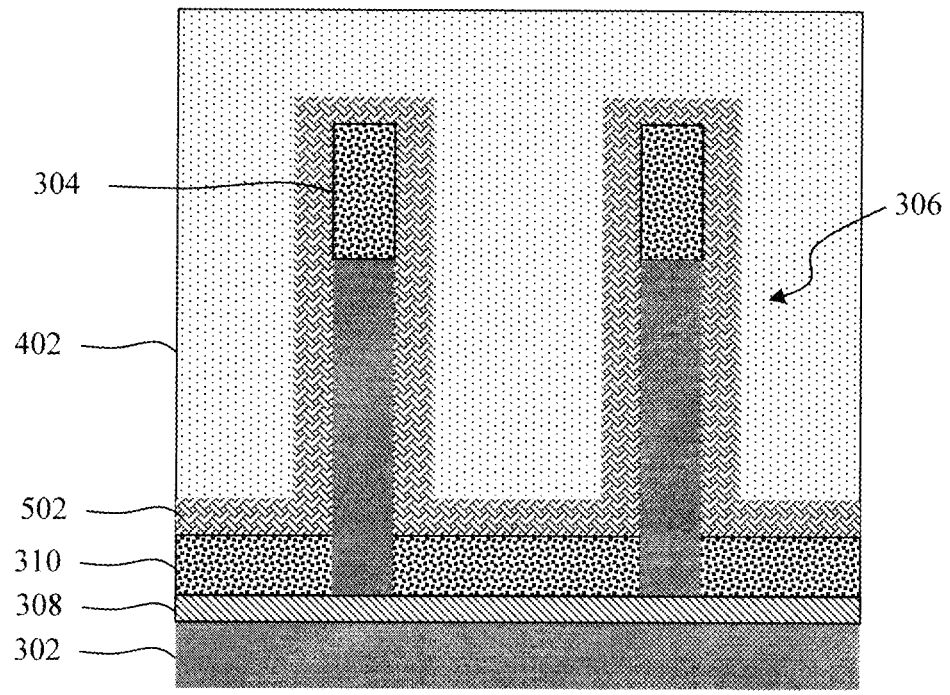
FIG. 5 is a cross-sectional diagram illustrating a monolayer of the organic polymer brush material having been grafted to the fin hardmasks, the fins, and the bottom spacers according to an embodiment of the present invention.
Figure 6:
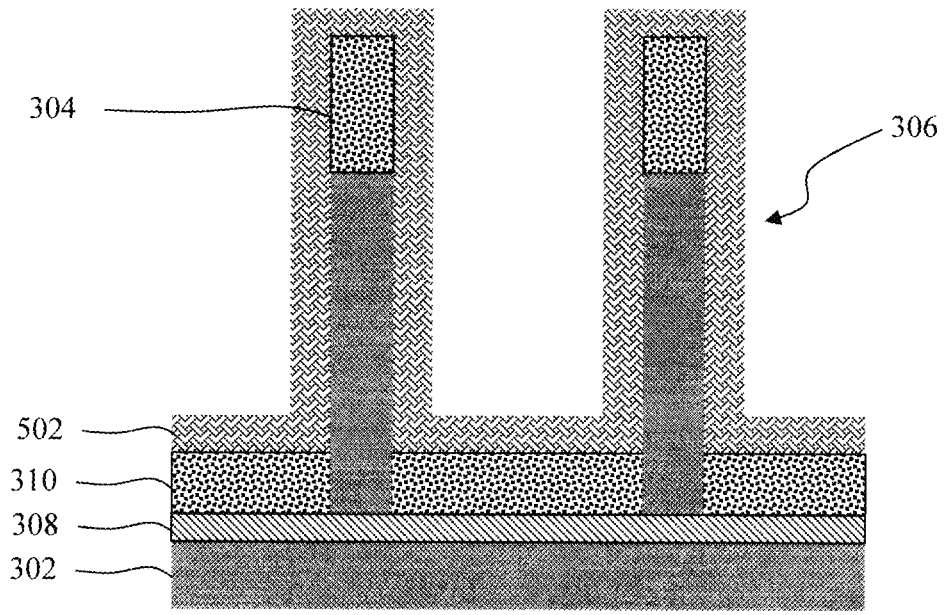
FIG. 6 is a cross-sectional diagram illustrating un-grafted (unreacted) portions of first polymer brush material having been rinsed away leaving behind the monolayer of the organic polymer brush material grafted to the fin hardmasks, the fins, and the bottom spacers according to an embodiment of the present invention.
Figure 7:
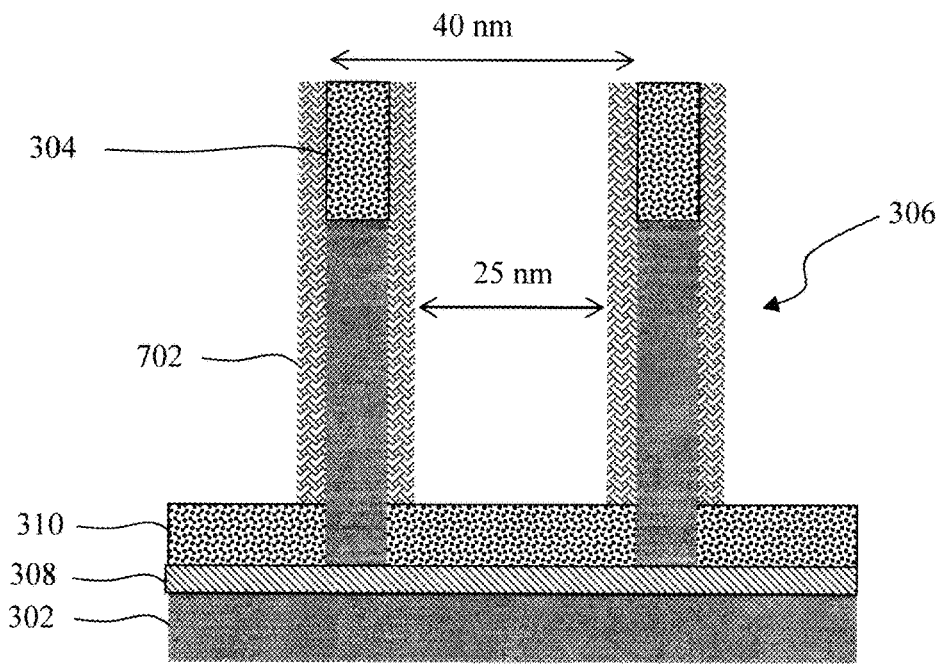
FIG. 7 is a cross-sectional diagram illustrating the monolayer of the organic polymer brush material having been patterned into first polymer spacers alongside opposite sidewalls of the fins according to an embodiment of the present invention.

An exemplary process for forming a VFET device is now described by way of reference to FIGS. 3-29. As shown in FIG. 3, the process begins with at least one fin 306 being patterned in a substrate 302. According to one exemplary embodiment, the substrate 302 is a bulk semiconductor wafer, such as a bulk silicon (Si), bulk germanium (Ge), bulk silicon germanium (SiGe) and/or bulk III-V semiconductor wafer. Alternatively, substrate 302 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor.

A patterned fin hardmask 304 is formed on the substrate marking the footprint and location of the fins 306. Suitable hardmask materials include, but are not limited to, nitride hardmask materials such as silicon nitride (SiN), silicon boron carbon nitride (SiBCN), silicon oxycarbon nitride (SiOCN), and/or silicon carbon nitride (SiCN). The fin hardmasks 304 are then used to etch the fins 306 in the substrate 302. According to an exemplary embodiment, the fin etch is carried out using a directional etching process such as reactive ion etching (RIE). As shown in FIG. 3, the fins 306, as patterned, extend partway through the substrate 302.

Next, as shown in FIG. 3, bottom source and drains 308 are formed in the substrate at the base of the fins 306. According to an exemplary embodiment, bottom source and drains 308 are formed using an ion implantation process to introduce dopants into the substrate 302 at the base of the fins 306. Suitable n-type dopants include, but are not limited to, phosphorous (P) and/or arsenic (As). Suitable p-type dopants include, but are not limited to, boron (B). Ion implantation is, however, only one technique contemplated herein for forming the bottom source and drains 308. For instance, alternatively, an in-situ (i.e., during growth) or ex-situ (e.g., via ion implantation) doped epitaxial source and drain material (e.g., epitaxial Si, Ge and/or SiGe) can instead be grown at the base of the fins 306.

Bottom spacers 310 are then formed on the bottom source and drains 308. See FIG. 3. According to an exemplary embodiment, the bottom spacers 310 are formed using a directional deposition process whereby a spacer material is deposited onto the bottom source and drains 308 with a greater amount of the material being deposited on the horizontal surfaces, as compared to the vertical surfaces. In that case, a greater thickness of the spacer material will be deposited on top of the bottom source and drains 308 than, for example, along the sidewalls of the fins 306. Thus, when an etch is used on the spacer material, the timing of the etch needed to remove the spacer material from the vertical surfaces will leave the bottom spacers 310 shown in FIG. 3 on top of the bottom source and drains 308 since a greater amount of the spacer material was present on the bottom source and drains 308 to begin with. By way of example only, a high density plasma (HDP) chemical vapor deposition (CVD) or physical vapor deposition (PVD) process can be used for directional film deposition, and an isotropic etch can be used to remove the (thinner) spacer material deposited onto the vertical surfaces. Suitable materials for the bottom spacers 310 include, but are not limited to, oxide spacer materials such as silicon dioxide ($SiO_2$) and/or silicon carbon oxide (SiCO), and nitride spacer materials such as SiN, SiBCN, SiOCN and/or SiCN.

A first polymer brush material 402 is then coated onto the fins 306 and bottom spacers 310. See FIG. 4. According to an exemplary embodiment, the first polymer brush material 402 is an organic brush material such as polystyrene. An organic polymer brush material does not have a preference for silicon oxide versus nitride, and thus the first polymer brush material 402 will graft to the fin hardmasks 304, the fins 306, and the bottom spacers 310. Thus, following an anneal (suitable conditions were provided above) a conformal, self-limiting thickness layer 502 of the organic polymer brush material is formed grafted to the fin hardmasks 304, the fins 306, and the bottom spacers 310. See FIG. 5. The un-grafted (unreacted) portion of first polymer brush material 402 is then rinsed away (see above) leaving behind the conformal layer 502 of the organic polymer brush material grafted to the fin hardmasks 304, the fins 306, and the bottom spacers 310. See FIG. 6.

A directional etching process such as RIE is then used to pattern the layer 502 of the organic polymer brush material into (first) polymer spacers 702 alongside opposite sidewalls of the fins 306. Specifically, this spacer etch serves to remove the layer 502 of the organic polymer brush material from horizontal surfaces, including from the tops of the fin hardmasks 304 and the bottom spacers 310. According to an exemplary embodiment, the polymer spacers 702 have a thickness of from about 2.5 nanometers (nm) to about 3.5 nm, and ranges therebetween.

Following the spacer etch, there are now exposed surfaces of different materials across the structure. For instance, there are now i) exposed silicon oxide/nitride surfaces (see above) of the fin hardmasks 304 and bottom spacers 310 and ii) exposed polymer surfaces of the polymer spacers 702. Selectivity of a second polymer brush material for grafting to the silicon oxide/nitride surfaces over the polymer surfaces will then be leveraged to set the gate length (Lg).

Figure 8:
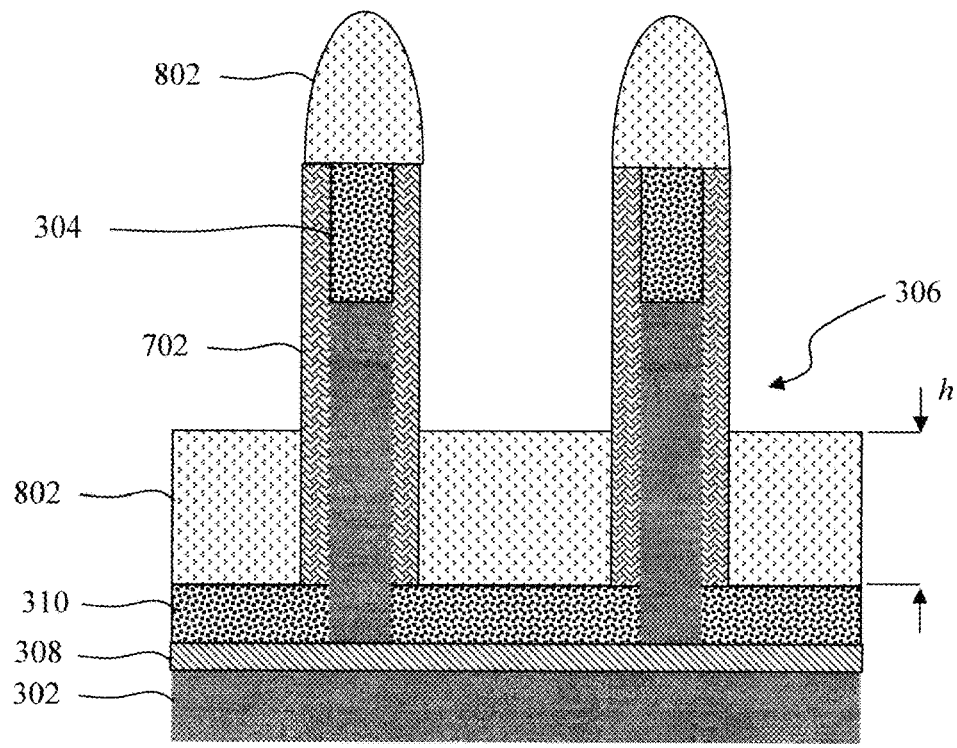
FIG. 8 is a cross-sectional diagram illustrating an Si-containing brush material having been grafted to the exposed silicon oxide/nitride surfaces (i.e., of the fin hardmasks and bottom spacers) forming second polymer spacers according to an embodiment of the present invention.

According to an exemplary embodiment, the second polymer brush material is an Si-containing brush material such as PDMS with a —COOH end-functional group (i.e., PDMS provides the SiOx and the end-group provides the grafting selectivity) which grafts selectively to the exposed silicon oxide/nitride surfaces (i.e., of the fin hardmasks 304 and bottom spacers 310) over the polymer surfaces (i.e., of the polymer spacers 702) to form (second) polymer spacers 802. See FIG. 8. Polymer spacers 802 are formed by the same process described above, whereby the Si-containing brush material is coated onto the fin hardmasks 304 and the bottom spacers 310 using, e.g., a casting process such as spin-coating. It is notable that, while the Si-containing brush material coated on the fin hardmasks 304 can be selectively removed (see below), it is possible to reduce or eliminate the Si-containing brush material on the fin hardmasks 304 by controlling the spin-coating thickness. As shown in FIG. 8, the polymer spacers 802 are offset from the fins 306 by the polymer spacers 702. The end-functional group of the Si-containing brush material has a preference for the exposed silicon oxide/nitride surfaces, and thus will graft to the fin hardmasks 304 and bottom spacers 310 following an anneal (suitable conditions were provided above). The un-grafted (unreacted) portion of the Si-containing brush material is then rinsed away leaving behind the polymer spacers 802 grafted to the fin hardmasks 304 and bottom spacers 310. According to an exemplary embodiment, the polymer spacers 802 are formed having a height h of from about 15 nanometers (nm) to about 20 nm, and ranges therebetween.

Figure 9:
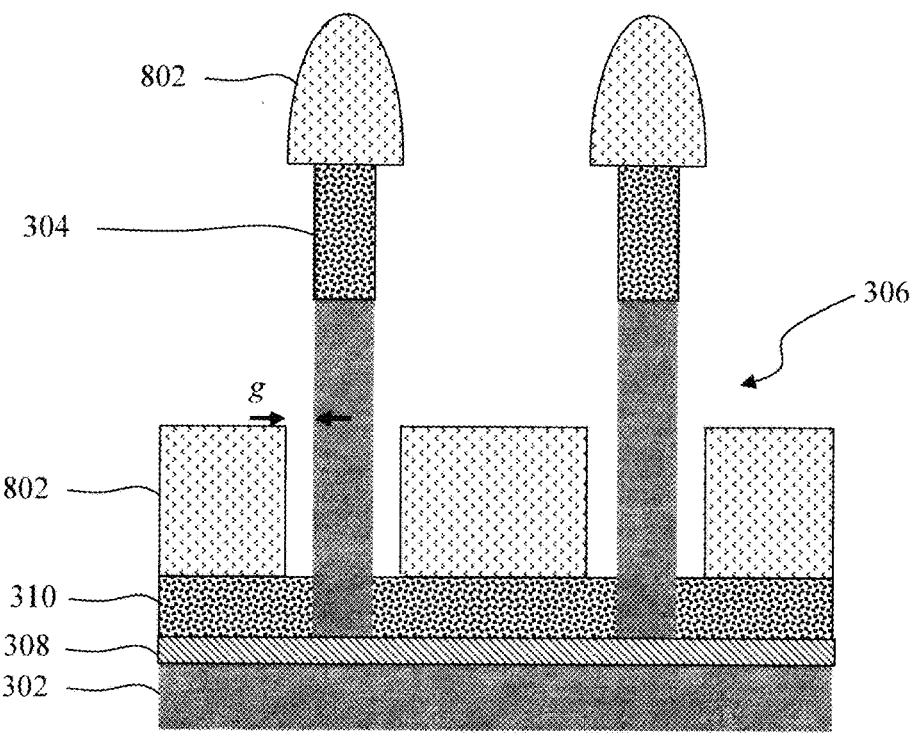
FIG. 9 is a cross-sectional diagram illustrating the first polymer spacers having been removed creating a gap in between the sidewalls of the fins and the second polymer spacers according to an embodiment of the present invention.

The polymer spacers 802 do not, however, graft to the polymer spacers 702. Thus, as shown in FIG. 9 the polymer spacers 702 can then be easily removed (e.g., via ashing) while oxidizing the polymer spacers 802 into silicon oxide-like materials. Removal of the polymer spacers 702 leaves a precise gap g in between the sidewalls of the fins 306 and the polymer spacers 802 equivalent to the thickness of the monolayer of the first polymer brush material used to form the polymer spacers 702 (see above).

A reflow of the polymer spacers 802 is then used to close the gap g. See FIG. 10. This reflow also results in densification of the polymer spacers 802. According to an exemplary embodiment, the reflow is performed by annealing the polymer spacers 802 at a temperature of from about 500° C. to about 1000° C., and ranges therebetween.

Figure 10:
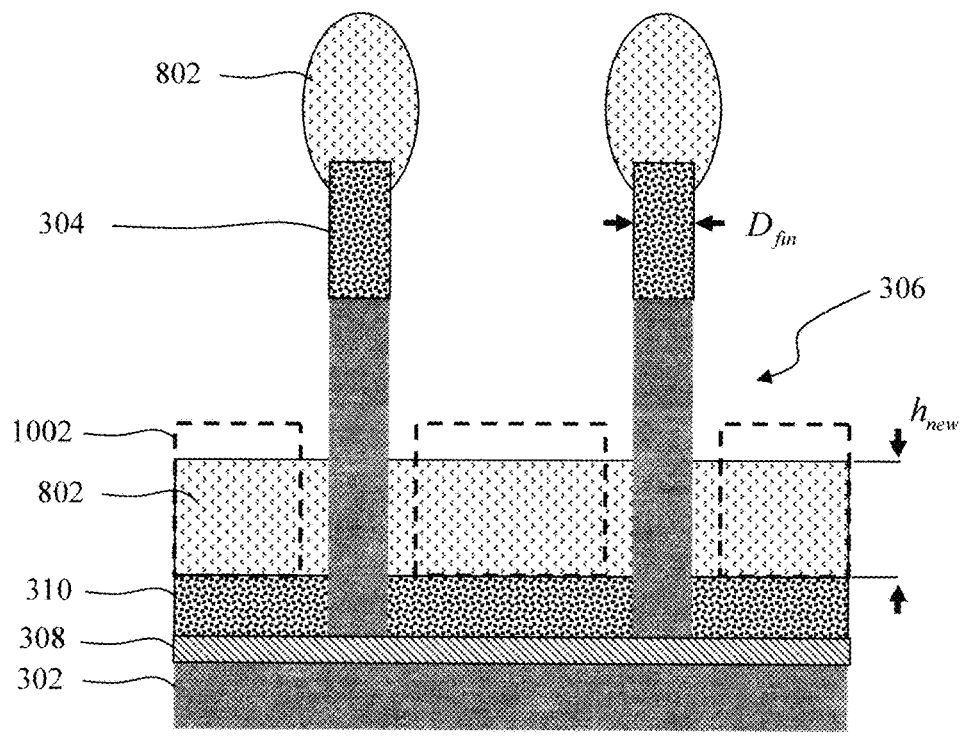
FIG. 10 is a cross-sectional diagram illustrating a reflow of the second polymer spacers having been used to close the gap according to an embodiment of the present invention.
Figure 11:
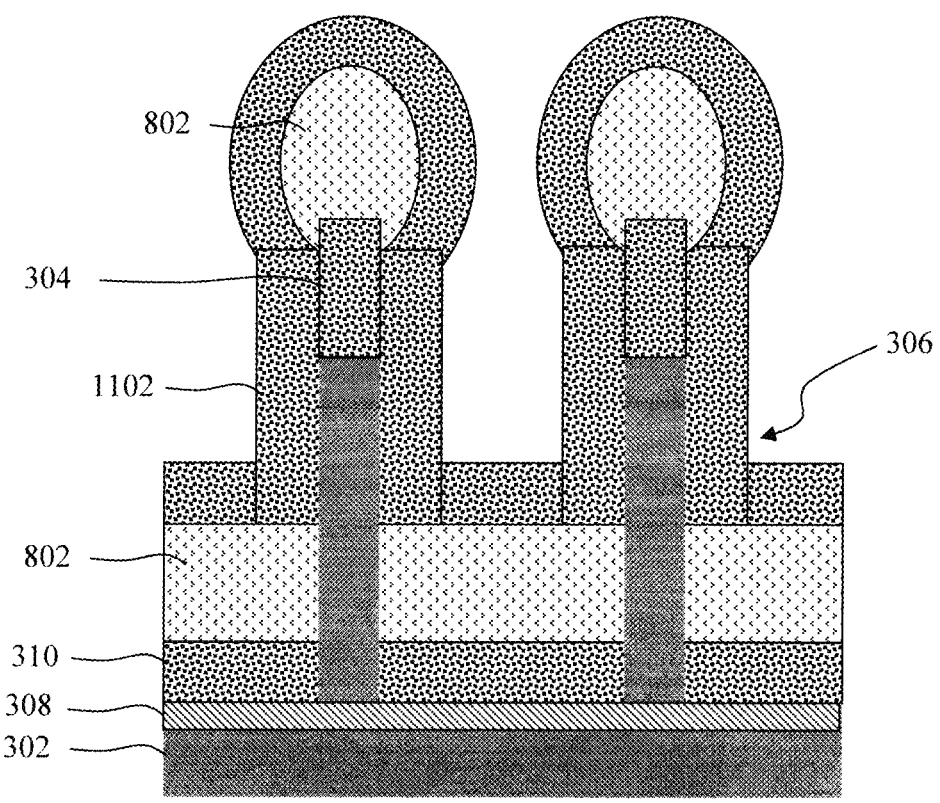
FIG. 11 is a cross-sectional diagram illustrating a cladding layer having been deposited over the second polymer spacers and fin hardmasks/fins according to an embodiment of the present invention.

As shown in FIG. 10, the reflow and densification will change the volume/height of the polymer spacers 802 (see dashed boxes 1002 indicating the dimensions of polymer spacers 802 prior to reflow). Given the height h of the polymer spacers 802 prior to reflow (see, e.g., FIG. 8—described above) and the gap g left by removal of the polymer spacers 702 (see, e.g., FIG. 9), the volume change/height difference of the polymer spacers 802 after reflow can be easily estimated. For instance, assuming an infinitely long fin/channel length L (i.e., $L \gg D_{fin}$) an (initial) height h of the polymer spacers 802 of 20 nm, and a gap g of 2 nm (on each side of the fins 306), the dimensions of the polymer spacers 802 after reflow can be calculated as follows:

$$\frac{h_{new}}{h} = \frac{(\text{pitch} - D_{fin} - 2*t_{brush})}{(\text{pitch} - D_{fin})} \Longrightarrow \frac{h_{new}(\text{pitch})}{20} = \frac{(\text{pitch} - 8 - 4)}{(\text{pitch} - 8)},$$

wherein h is the height of the polymer spacers 802 prior to reflow (see, e.g., FIG. 8—described above), $h_{new}$ is the height of the polymer spacers 802 after reflow, $D_{fin}$ is the width of the fins 306, and $t_{brush}$ is the thickness of the first polymer brush material used to form the polymer spacers 702, wherein $t_{brush}$ is a thickness in the horizontal direction, whereas h and $h_{new}$ are height measurements in the vertical direction. Pitch is the distance from a given point on one fin 306 to the same given point on an adjacent fin 306.

A cladding layer 1102 is then conformally deposited over the polymer spacers 802 and fin hardmasks 304/fins 306. See FIG. 11. Suitable conformal deposition processes include, but are not limited to, chemical vapor deposition (CVD) and atomic layer deposition (ALD). Suitable cladding materials include, but are not limited to, SiN, SiBCN, SiOCN, and/or SiCN. According to an exemplary embodiment, the cladding layer 1102 is formed having a thickness of from about 5 nm to about 8 nm, and ranges therebetween.

Figure 12:
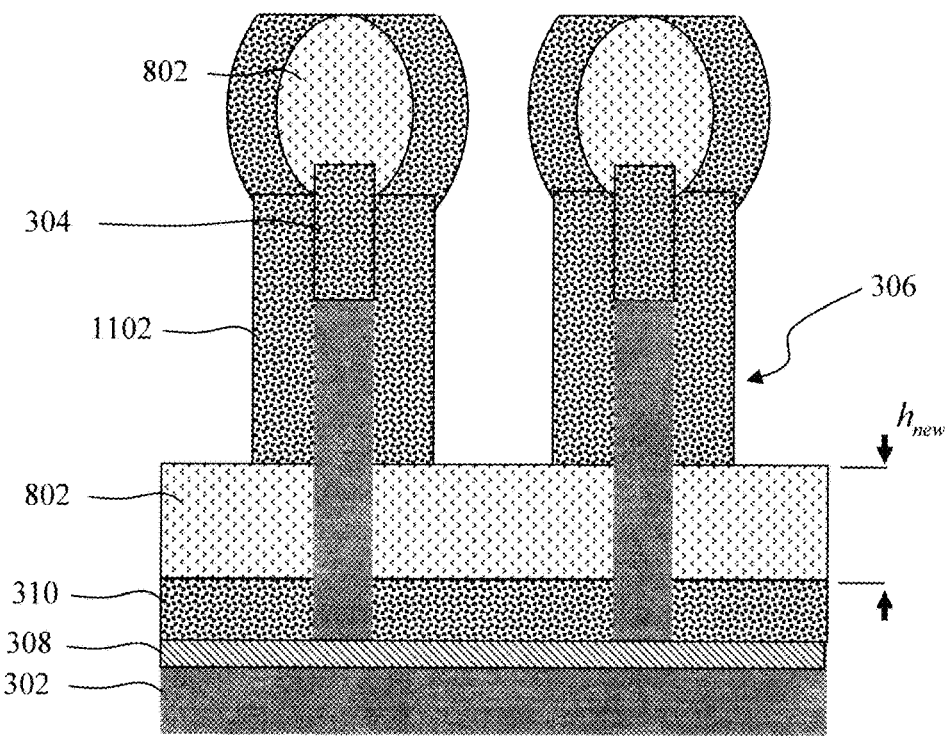
FIG. 12 is a cross-sectional diagram illustrating a directional etch having been used to remove the cladding layer from horizontal surfaces including from the top surface of the second polymer spacers in between the fins according to an embodiment of the present invention.
Figure 13:
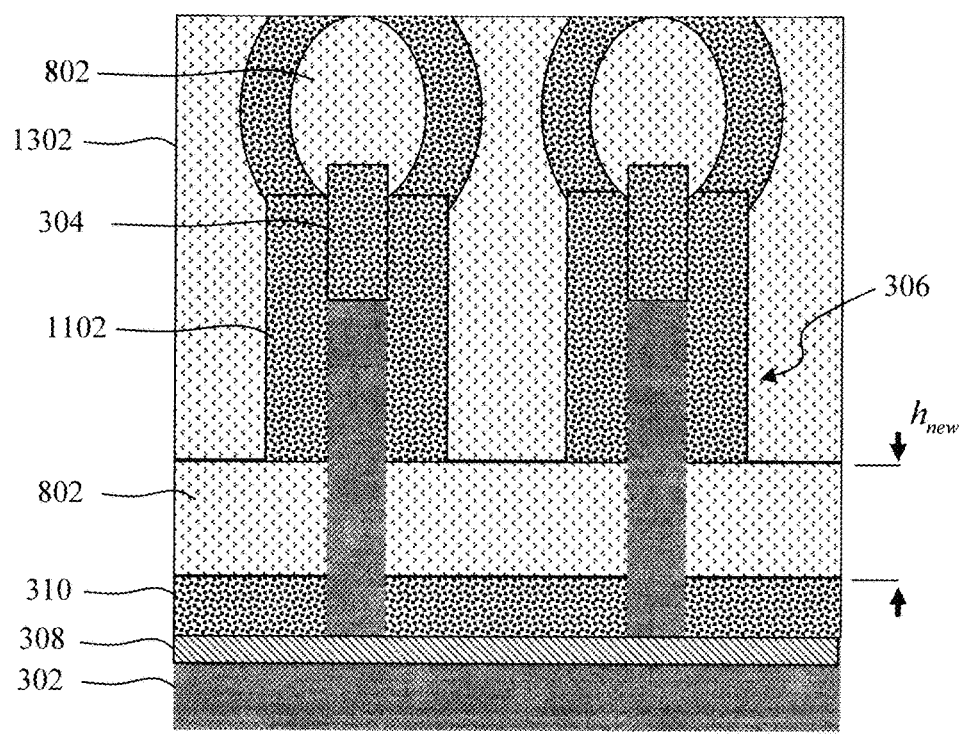
FIG. 13 is a cross-sectional diagram illustrating the fins having been buried in a dielectric fill material according to an embodiment of the present invention.
Figure 14:
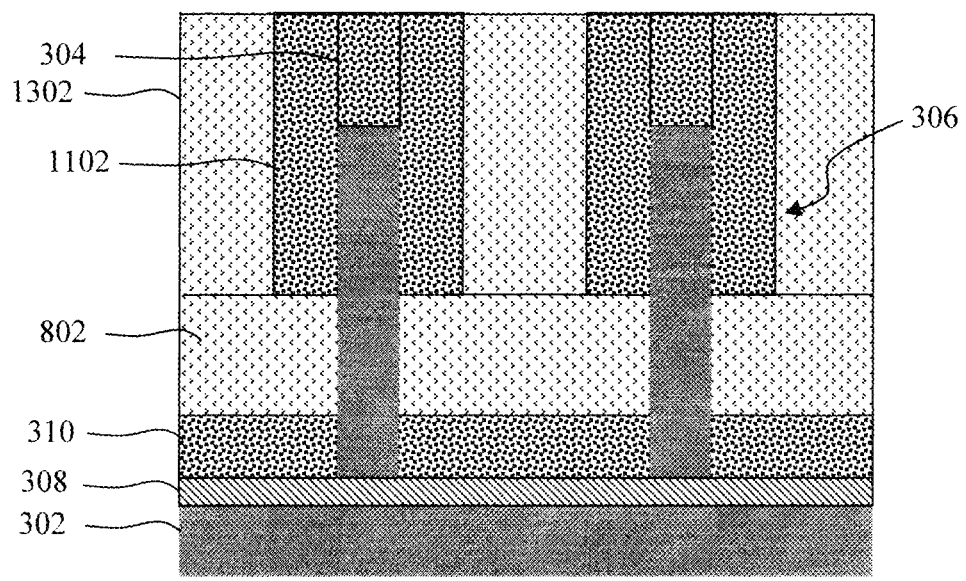
FIG. 14 is a cross-sectional diagram illustrating the dielectric fill material having been polished down to the fin hardmasks according to an embodiment of the present invention.
Figure 15:
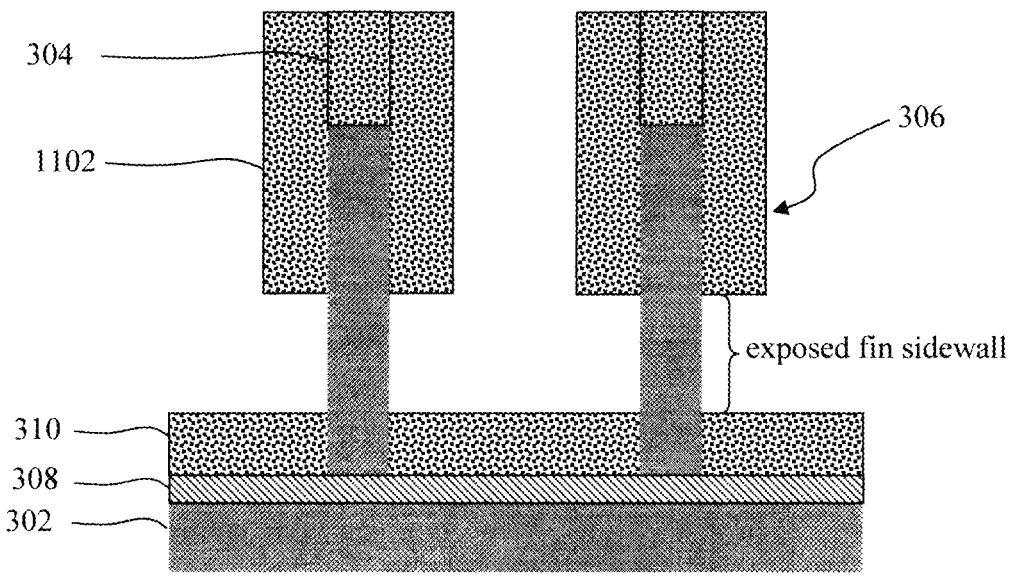
FIG. 15 is a cross-sectional diagram illustrating the dielectric fill material as well as the second polymer spacers having been removed selective to the bottom spacers, cladding layer and the fins according to an embodiment of the present invention.
Figure 16:
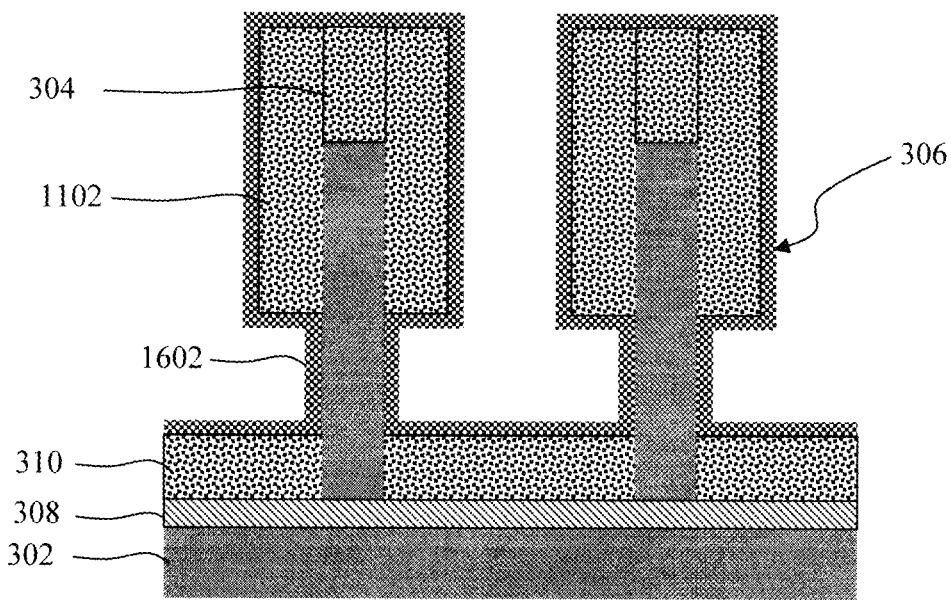
FIG. 16 is a cross-sectional diagram illustrating a gate dielectric having been deposited onto the fin hardmasks, exposed sidewalls of the fins, bottom spacers and cladding layer according to an embodiment of the present invention.

A directional etch is then used to remove the cladding layer 1102 from horizontal surfaces including from the top surface of the polymer spacers 802 in between the fins 306. See FIG. 12. Suitable directional etching processes include, but are not limited to, reactive ion etching (ME). For instance, when the cladding layer 1102 is formed from a nitride material (see above), a nitride-selective RIE can be employed with the (e.g., PDMS) polymer spacers 802 acting as an etch stop. It is notable, however, that this etch selectivity and etch stop on polymer spacers 802 is preferred but not necessary, as the Lg is fixed no matter whether the polymer spacers 802 are recessed or not, as can be seen in FIG. 12. As a result, the cladding layer 1102 remains alongside the opposite sidewalls of the fins 306 and at the tops of the fins 306 above the polymer spacers 802. It is notable that the gate length (Lg), between the bottom spacers 310 and the cladding layer 1102, is set via the height ($h_{new}$—see FIG. 10) of the polymer spacers 802.

The fins 306 are then buried in a dielectric fill material 1302. See FIG. 13. Suitable dielectric fill materials include, but are not limited to, $SiO_2$ and/or SiCO. The dielectric fill material 1302 enables use of a process, such as chemical-mechanical polishing (CMP), to provide a flat, planar surface for further processing. See, for example, FIG. 14 which illustrates the dielectric fill material 1302 having been polished down to the fin hardmasks 304 using, e.g., CMP.

The dielectric fill material 1302 as well as the polymer spacers 802 are then removed selective to the bottom spacers 310, cladding layer 1102 and the fins 306. See FIG. 15. According to an exemplary embodiment, the dielectric fill material 1302 and the polymer spacers 802 are both oxide materials (e.g., $SiO_2$ and oxidized PDMS, respectively) which can be removed using a wet etch with hydrofluoric acid (HF) and/or a chemical oxide removal (COR) process. The COR process is described, for example, in Hagimoto et al., "Evaluation of the plasmaless gaseous etching process," Solid State Phenomena, vol. 134, pp. 7-10 (2008) (published November 2007), the contents of which are incorporated by reference as if fully set forth herein.

Gates (i.e., a gate dielectric and gate conductor) are next formed alongside the fins 306. Notably, the amount of the fin 306 sidewalls that is exposed, i.e., based on the distance between the bottom spacers 310 and the cladding layer 1102 (alongside which the gates will be formed) is set by removal of the polymer spacers 802 (e.g., a monolayer of the Si-containing brush material). See FIG. 15. This will be used to set the gate length (Lg). By comparison, with conventional processes the gate materials are often deposited over the entire fin and then etched back which sets the gate length. However, such an etch-based process is subject to a large variation including within wafer, wafer-to-wafer, batch-to-batch, tool dependency, and pattern density (i.e., etch microloading) effect.

To begin the gate formation, a gate dielectric 1602 is first conformally deposited onto the fin hardmasks 304, exposed sidewalls of the fins 306, bottom spacers 310 and cladding layer 1102. See FIG. 16. According to an exemplary embodiment, the gate dielectric 1602 is deposited to a thickness of from about 0.5 nm to about 2 nm, and ranges therebetween. A gate conductor 1702 is then conformally deposited onto the gate dielectric 1602. See FIG. 17. According to an exemplary embodiment, the gate conductor 1702 is deposited to a thickness of from about 4 nm to about 6 nm, and ranges therebetween. Suitable conformal deposition processes include, but are not limited to ALD.

According to an exemplary embodiment, the gate dielectric 1602 is a high-κ gate dielectric and the gate conductor 1702 is a workfunction setting metal. The particular workfunction setting metal employed can vary depending on whether an NFET (n-type workfunction setting metal) or PFET (p-type workfunction setting metal) is being formed. Suitable n-type workfunction setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction setting metals include, but are not limited to, TiN, TaN, and tungsten (W). TiN and TaN are relatively thick (e.g., greater than about 2 nanometers (nm)) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above.

The term "high-κ" as used herein refers to a material having a relative dielectric constant κ which is much higher than that of silicon dioxide (e.g., a dielectric constant κ=25 for hafnium oxide ($HfO_2$) rather than 4 for silicon dioxide). Suitable high-κ gate dielectrics include, but are not limited to, $HfO_2$ and/or lanthanum oxide ($La_2O_3$).

Figure 17:
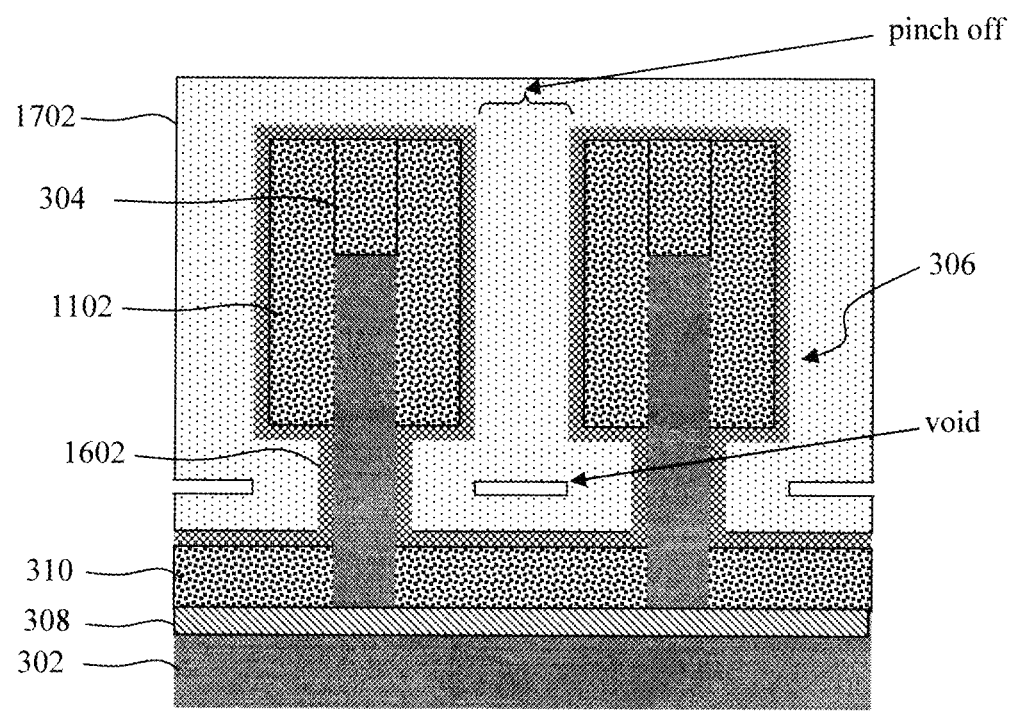
FIG. 17 is a cross-sectional diagram illustrating a gate conductor having been deposited onto the gate dielectric according to an embodiment of the present invention.

As shown in FIG. 17, due to the conformal deposition process, the opening at the tops of the fins 306 might get pinched off before the gate conductor 1702 fully fills the space between the fins 306, resulting in voids in the gate conductor 1702 below the cladding layer 1102. These voids will however be removed via a directional etch performed in the next step.

Figure 18:
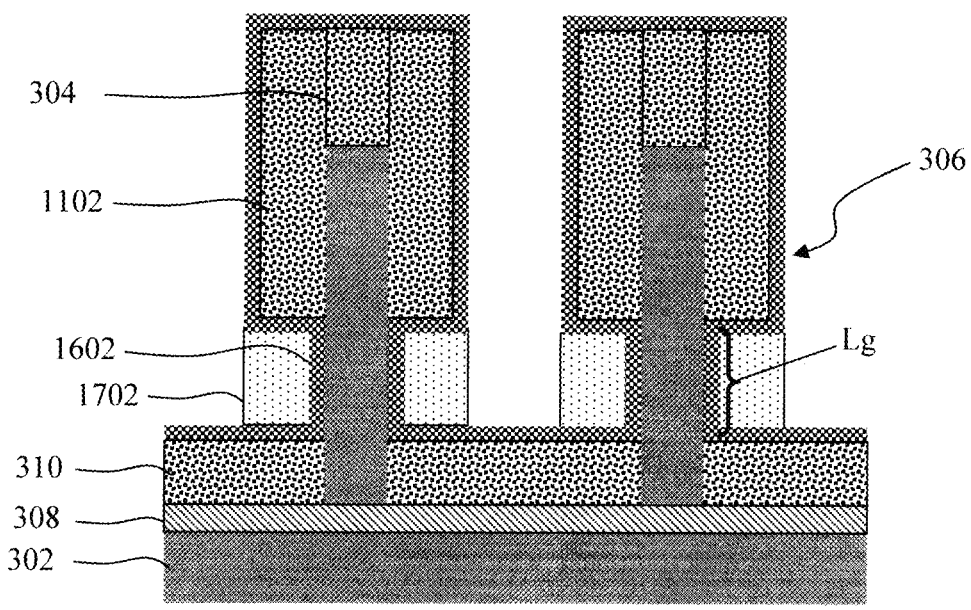
FIG. 18 is a cross-sectional diagram illustrating a directional etch having been used to pattern the gate conductor according to an embodiment of the present invention.

Namely, as shown in FIG. 18 a directional etch (e.g., RIE) is used to pattern the gate conductor 1702. This directional etch is shadowed by the cladding layer 1102. Thus, the gate conductor 1702 alongside the fin 306 sidewalls below the cladding layer 1102 remains following the etch. However, the gate conductor 1702 exposed between the fins 306 is removed, and along with it any of the voids that may have formed during the gate conductor 1702 deposition.

As shown in FIG. 18, this directional etch defines the gate length (Lg) below the cladding layer 1102. As provided above, the amount of exposed fin 306 sidewall is set by removal of the polymer spacers 802, i.e., the monolayer of the Si-containing brush material. Thus, the Lg is defined by the monolayer thickness of the Si-containing brush material which is consistent from one device to another.

The gate dielectric 1602 is then recessed. However, the recessed height of the gate dielectric 1602 is not critical since the Lg has already been defined. To recess the gate dielectric 1602, the fin hardmasks 304/fins 306, the cladding layer 1102 and the gates are buried in a fill material 1902.

Figure 19:
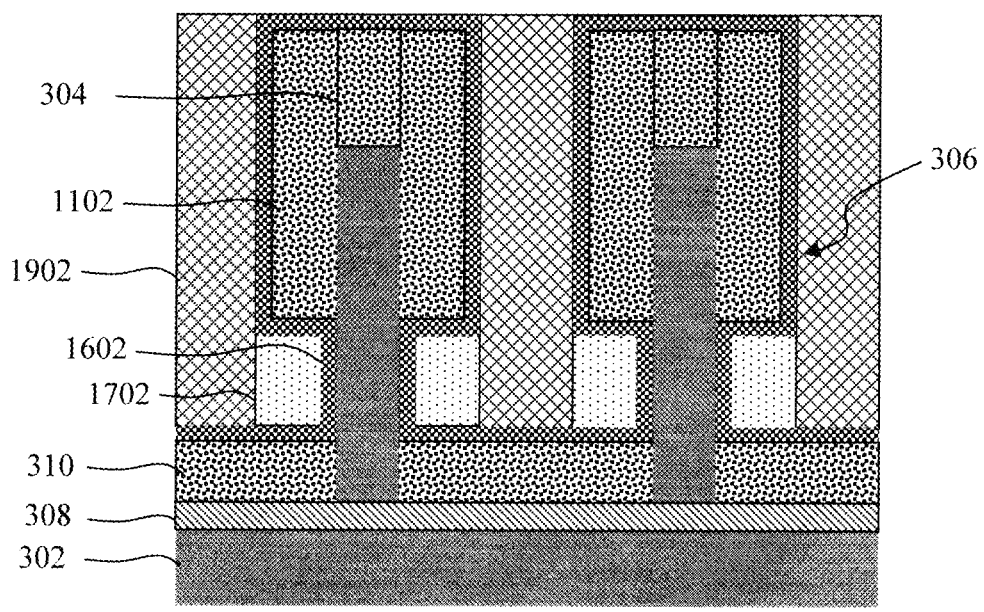
FIG. 19 is a cross-sectional diagram illustrating the fin hardmasks/fins, the cladding layer and the gates having been buried in a dielectric fill material according to an embodiment of the present invention.
Figure 20:
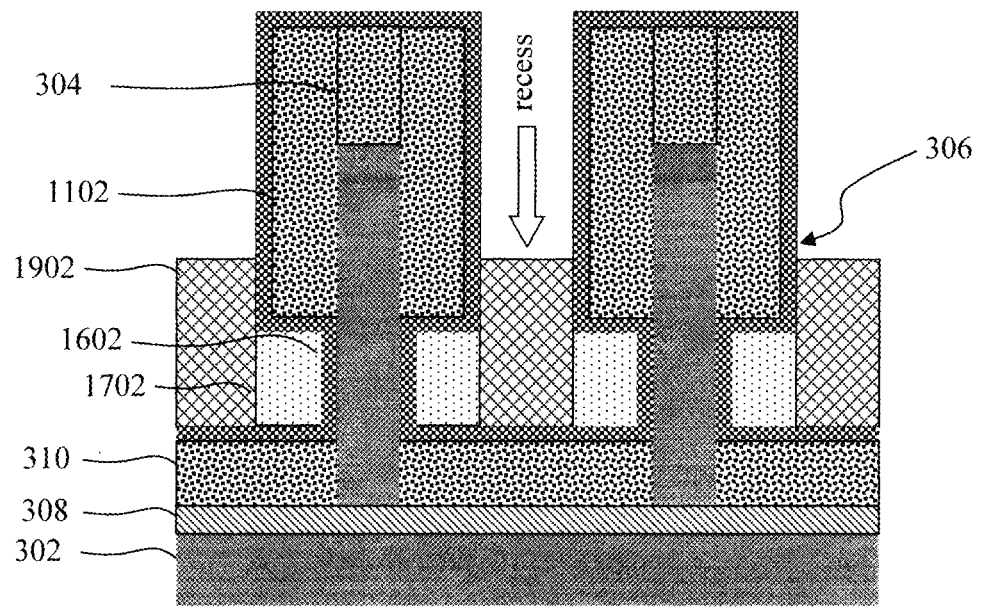
FIG. 20 is a cross-sectional diagram illustrating an etch having been used to recess the dielectric fill material according to an embodiment of the present invention.

See FIG. 19. As shown in FIG. 20, the as-deposited fill material 1902 can be etched back to provide a flat planar surface. Suitable dielectric fill materials include, but are not limited to, organic planarizing (OPL) materials.

An etch is then used to recess the fill material 1902. See FIG. 20. Standard lithography and etching techniques can be employed for the recess etch. This recess of the fill material 1902 will set the height of the (to be recessed—see below) gate dielectric 1602. However, as provided above, the recessed height of the gate dielectric 1602 is not critical since the Lg has already been defined. According to an exemplary embodiment, the fill material 2002 is recessed below the tops of the fins 306, but still overlaps the cladding layer 1102. See FIG. 20.

Figure 21:
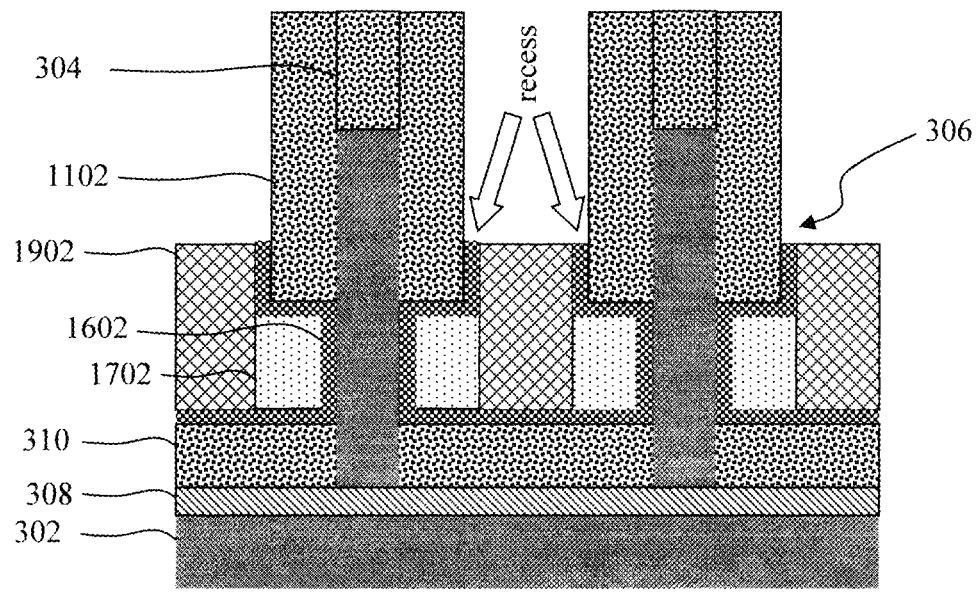
FIG. 21 is a cross-sectional diagram illustrating an etch having been used to recess the gate dielectric according to an embodiment of the present invention.
Figure 22:
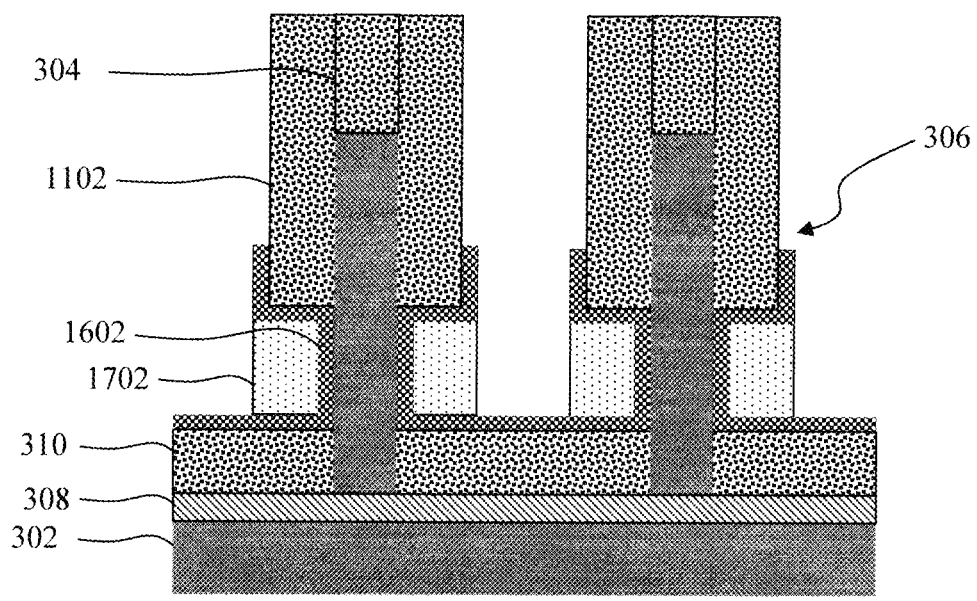
FIG. 22 is a cross-sectional diagram illustrating the dielectric fill material having been removed according to an embodiment of the present invention.
Figure 23:
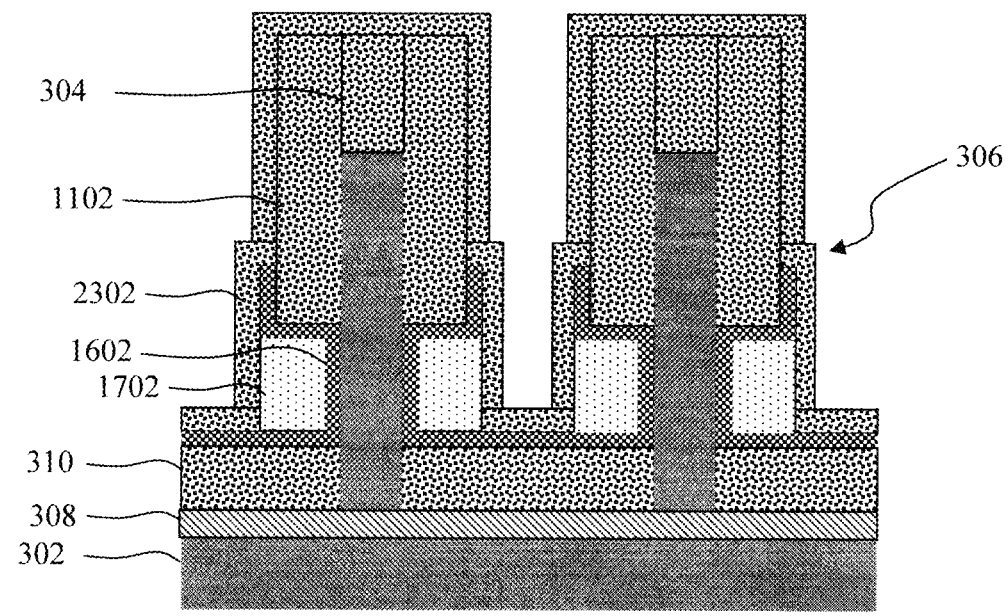
FIG. 23 is a cross-sectional diagram illustrating an encapsulation layer having been deposited over the fin hardmasks/fins, the cladding layer and the gates according to an embodiment of the present invention.

An etch is then used to recess the gate dielectric 1602. See FIG. 21. Again, standard lithography and etching techniques can be employed for the recess etch. As shown in FIG. 21, the gate dielectric is recessed to the height of the recessed fill material 1902. The fin hardmasks 304 and the cladding layer 1102 at the tops of the fins 306 are now exposed. The remaining fill material 1902 is then removed, e.g., by ashing. See FIG. 22.

An encapsulation layer 2302 is then conformally deposited over the fin hardmasks 304/fins 306, the cladding layer 1102 and the gates. See FIG. 23. Suitable materials for the encapsulation layer 2302 include, but are not limited to, SiN, SiBCN, SiOCN, and/or SiCN. Suitable conformal deposition processes include, but are not limited to, ALD. According to an exemplary embodiment, the encapsulation layer is formed having a thickness of from about 2 nm to about 3 nm, and ranges therebetween. The encapsulation layer 2302 will protect the gates during the subsequent processing steps.

Figure 24:
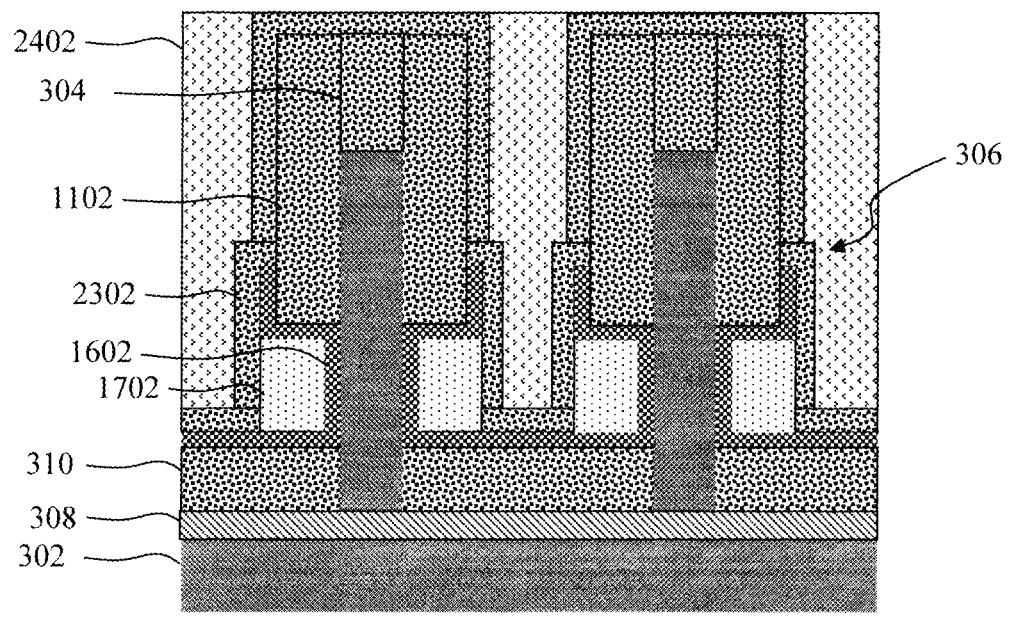
FIG. 24 is a cross-sectional diagram illustrating an insulator having been deposited over the encapsulation layer, burying the fins according to an embodiment of the present invention.
Figure 25:
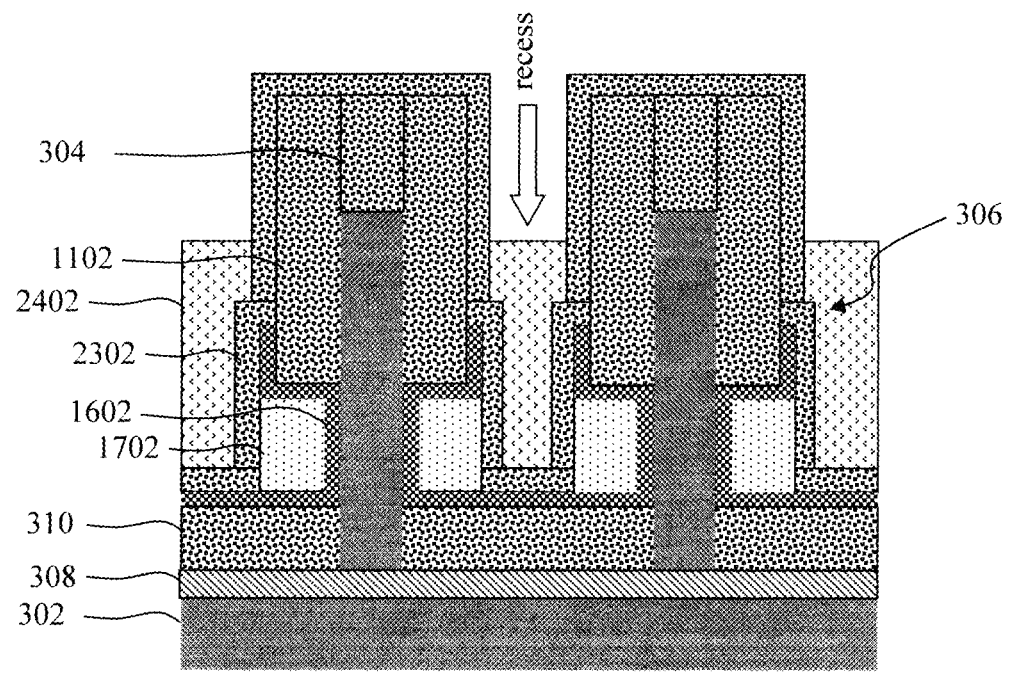
FIG. 25 is a cross-sectional diagram illustrating an etch having been performed to recess the insulator below the tops of the fins according to an embodiment of the present invention.
Figure 26:
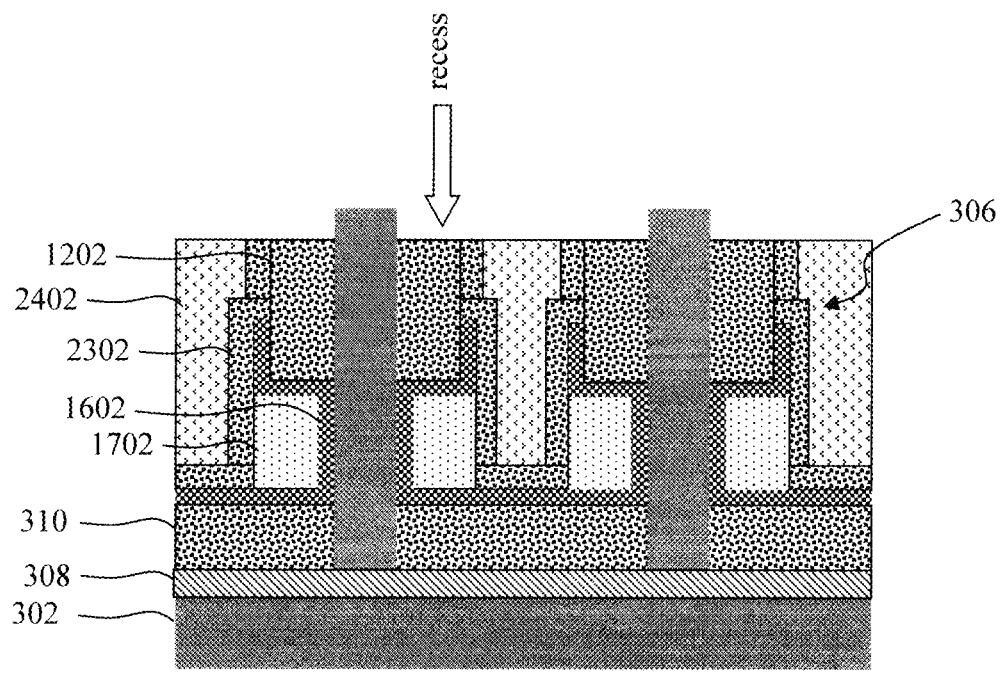
FIG. 26 is a cross-sectional diagram illustrating an etch having been performed to recess the encapsulation layer and the cladding layer and to remove the fin hardmasks from the tops of the fins according to an embodiment of the present invention.
Figure 27:
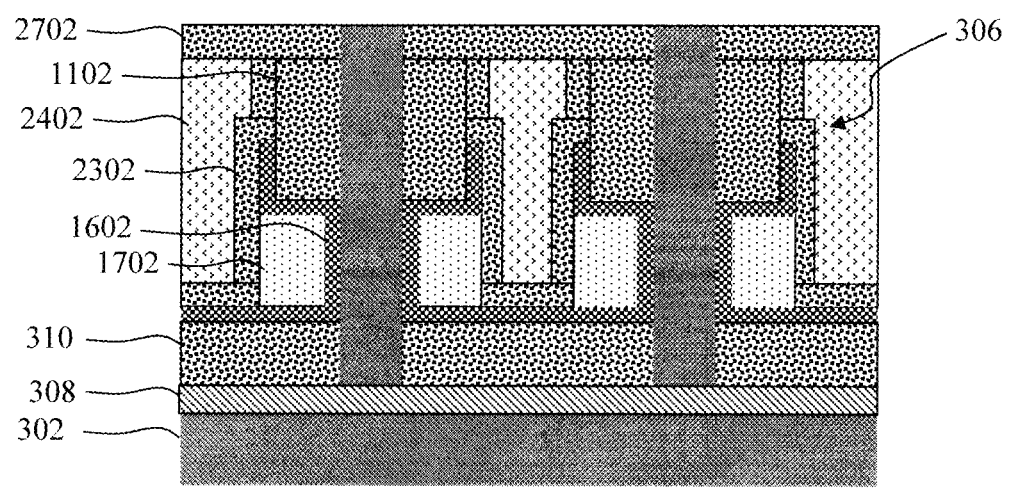
FIG. 27 is a cross-sectional diagram illustrating top spacers having been formed above the cladding layer according to an embodiment of the present invention.
Figure 28:
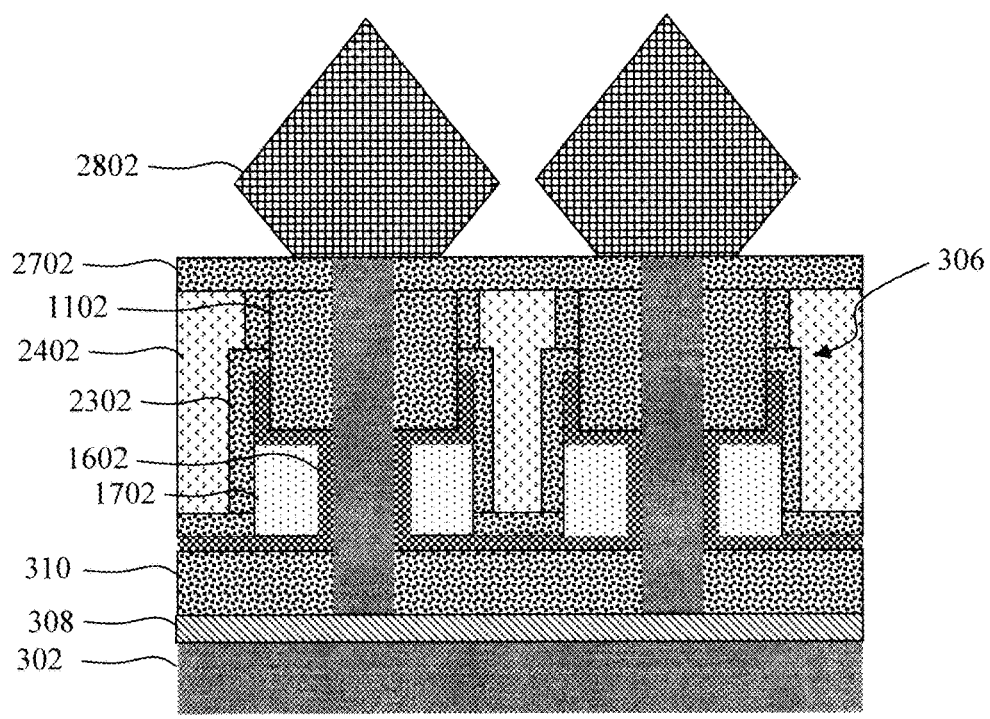
FIG. 28 is a cross-sectional diagram illustrating top source and drains having been formed at the tops of the fins above the top spacers according to an embodiment of the present invention.

Namely, as shown in FIG. 24 an insulator 2402 is then deposited over the encapsulation layer 2302, burying the fins 306. As shown in FIG. 24, the as-deposited insulator 2402 can be polished using a process such as CMP to provide a flat planar surface. Suitable insulators include, but are not limited to, $SiO_2$ and/or SiCO. An etch is then performed to recess the insulator 2402 below the tops of the fins 306. See FIG. 25. By way of example only, when the insulator 2402 is formed from an oxide material (e.g., $SiO_2$ and/or SiCO), an oxide-selective etching process such as an oxide-selective RIE can be used for the recess etch. This recess etch of the insulator 2402 exposes the encapsulation layer 2302, the cladding layer 1102 and the fin hardmasks 304 at the tops of the fins 306.

An etch is then performed to recess the encapsulation layer 2302 and the cladding layer 1102 and to remove the fin hardmasks 304 from the tops of the fins 306. See FIG. 26. By way of example only, when the encapsulation layer 2302, the cladding layer 1102 and the fin hardmasks 304 are formed from a nitride material (e.g., SiN, SiBCN, SiOCN and/or SiCN), a nitride-selective etching process such as a nitride-selective RIE can be used for the recess etch. Following this recess etch, the tops of the fins 306 are now exposed.

Top spacers 2702 are then formed above the cladding layer 1102. See FIG. 27. Like the bottom spacers 310, the top spacers 2702 can be formed using a directional deposition process (such as HDP CVD or PVD) whereby a greater amount of a spacer material is deposited onto horizontal surfaces, as compared to vertical surfaces. In that case, a greater thickness of the spacer material will be deposited on top of the (recessed) encapsulation layer 2302, cladding layer 1102 and insulator 2402 than, for example, along the sidewalls of the fins 306. Thus, when an etch is used on the spacer material, the timing of the etch needed to remove the spacer material from the vertical surfaces will leave the top spacers 2702 shown in FIG. 27. Suitable materials for the top spacers 2702 include, but are not limited to, oxide spacer materials such as $SiO_2$ and/or SiCO, and nitride spacer materials such as SiN, SiBCN, SiOCN and/or SiCN.

Top source and drains 2802 are then formed at the (exposed) tops of the fins 306 above the top spacers 2702. See FIG. 28. According to an exemplary embodiment, the top source and drains 2802 are formed using epitaxial growth (Si, Ge, SiGe, etc.) from the exposed tops of the fins 306. The top source and drains 2802 are doped in-situ (e.g., during growth) or ex-situ (e.g., via ion implantation) with an n-type or p-type dopant. As provided above, suitable n-type dopants include, but are not limited to, phosphorous (P) and arsenic (As), and suitable p-type dopants include boron (B).

Figure 29:
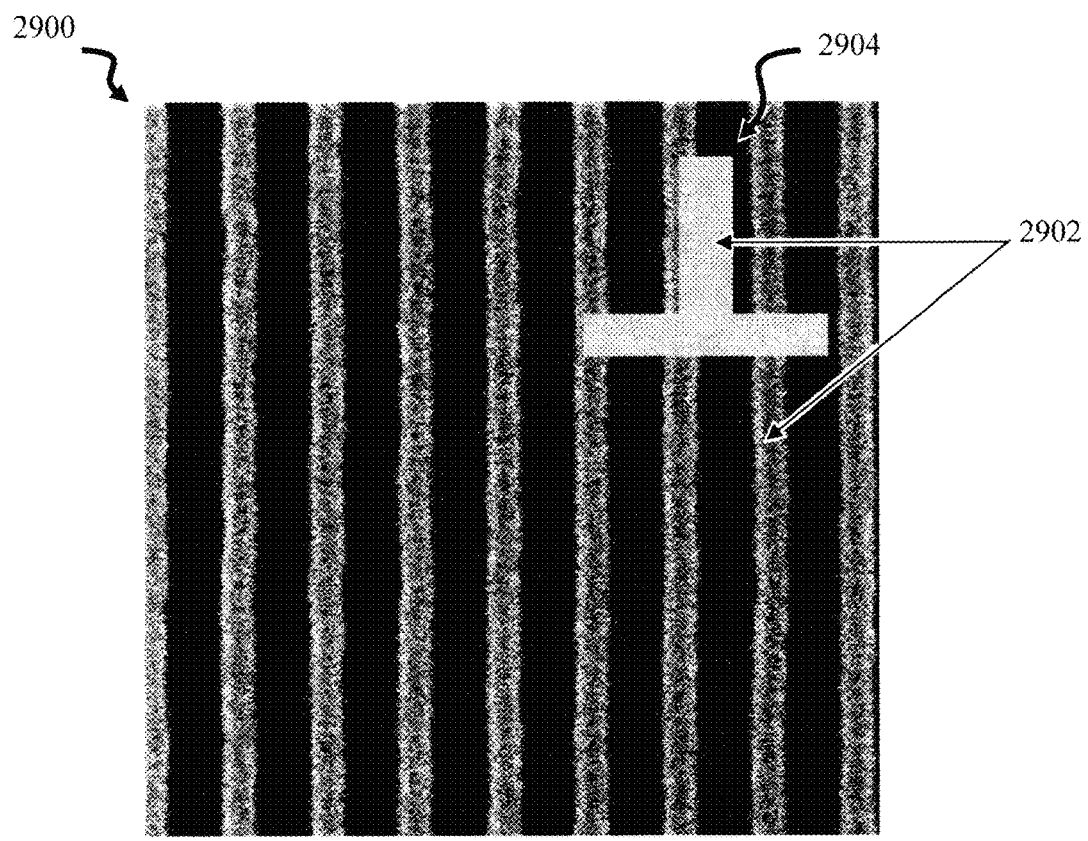
FIG. 29 is a top-down image of fins patterned in a Si substrate according to an embodiment of the present invention.
Figure 30:
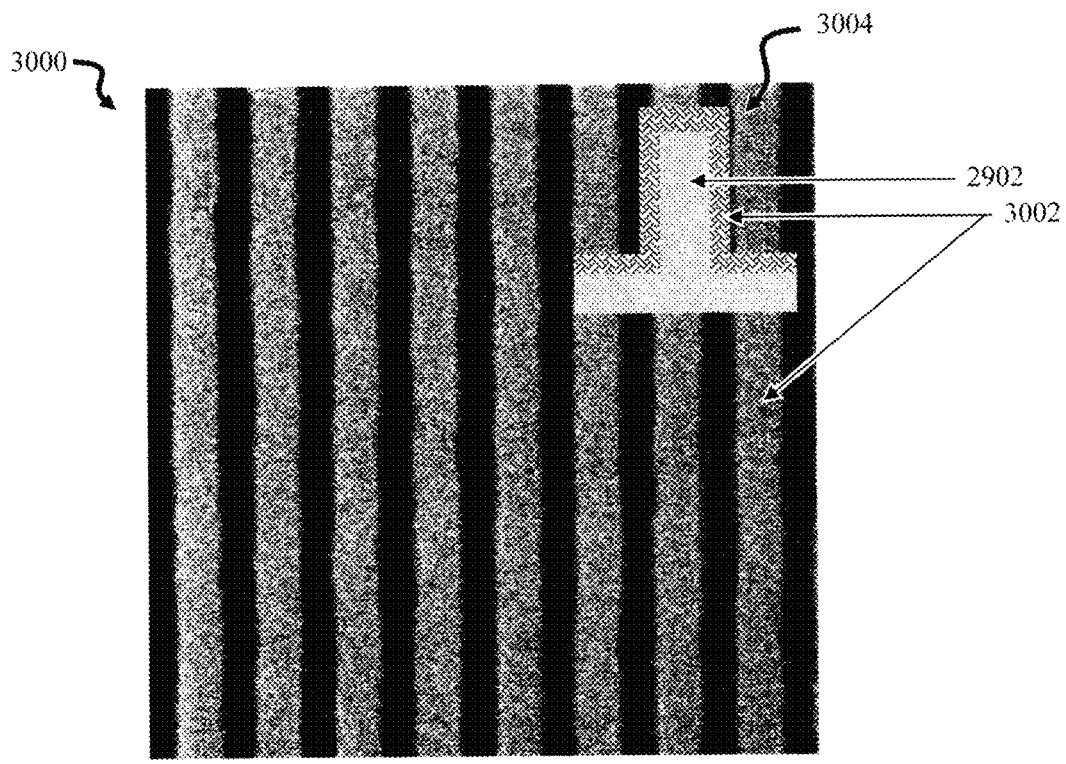
FIG. 30 is a top-down image of a monolayer of an (e.g., organic) brush material having been formed over the fins according to an embodiment of the present invention.
Figure 31:
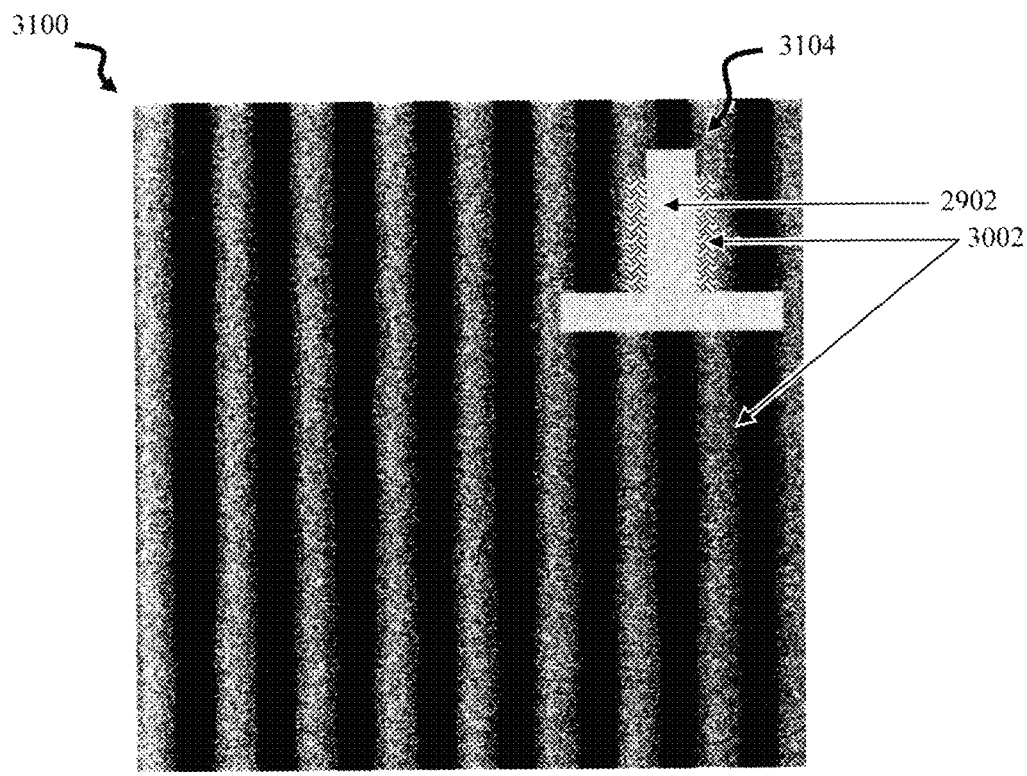
FIG. 31 is a top-down image of the organic brush material having been patterned according to an embodiment of the present invention.

The present techniques are further illustrated by way of reference to the following, non-limiting examples. FIGS. 29-31 are images illustrating the critical dimension (CD) change before and after the brush process. Specifically, FIG. 29 is a top-down image 2900 of fins 2902 patterned in a Si substrate. Inset 2904 illustrates a stage of the above-described process to which image 2900 corresponds. By way of example only, image 2900 is exemplary of the structure described in accordance with the description of FIG. 3 above. In this example, the fins 2902 as patterned have a CD of about 19.8 nm.

FIG. 30 is a top-down image 3000 of a monolayer of an (e.g., organic) brush material 3002 having been formed over the fins 2902. Inset 3004 illustrates a stage of the above-described process to which image 3000 corresponds. By way of example only, image 3000 is exemplary of the structure described in accordance with the description of FIG. 6 above. The brush material 3002 increases the CD to about 29.4 nm.

FIG. 31 is a top-down image 3100 of the brush material 3002 having been patterned. Inset 3104 illustrates a stage of the above-described process to which image 3100 corresponds. By way of example only, image 3100 is exemplary of the structure described in accordance with the description of FIG. 7 above. Following patterning of the brush material 3002 the CD is from about 23 nm to about 24 nm. Therefore, the thickness of the brush material 3002 is about 2 nm on each side of the fins 2902.

Figure 32:
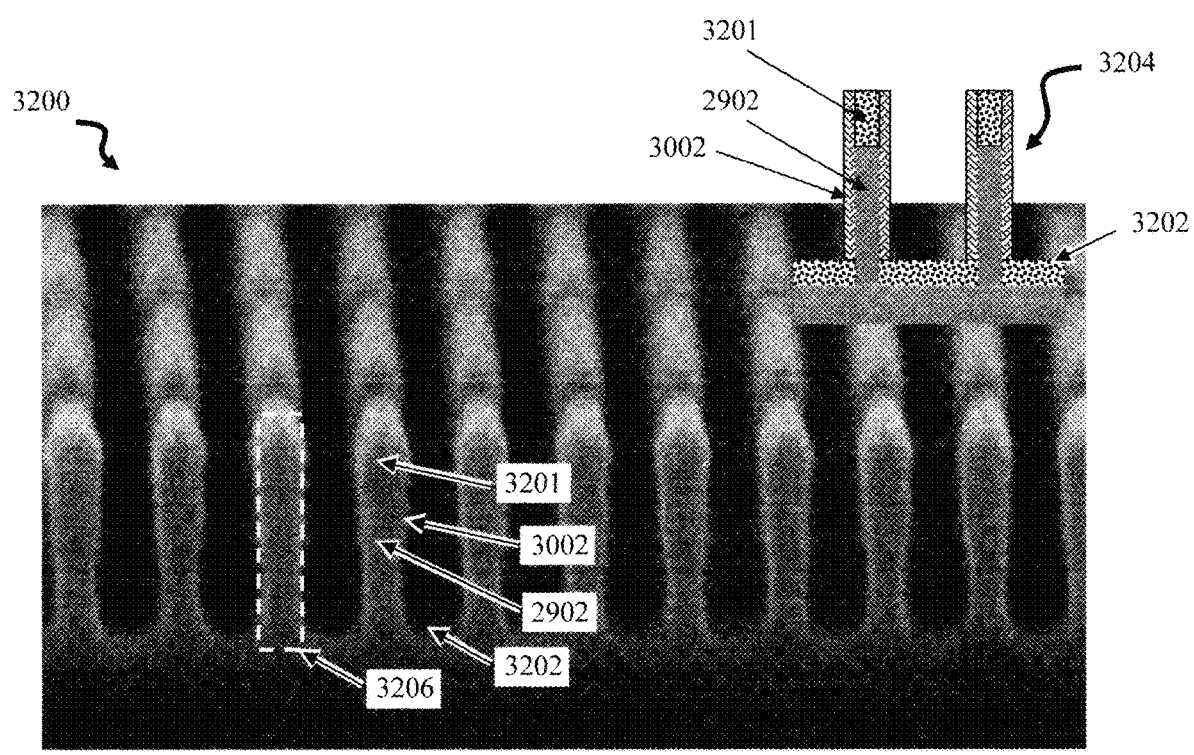
FIG. 32 is a three-dimensional image of the organic brush material having been grafted to the fins and fin hardmasks (above bottom spacers) and etched according to an embodiment of the present invention.
Figure 33:
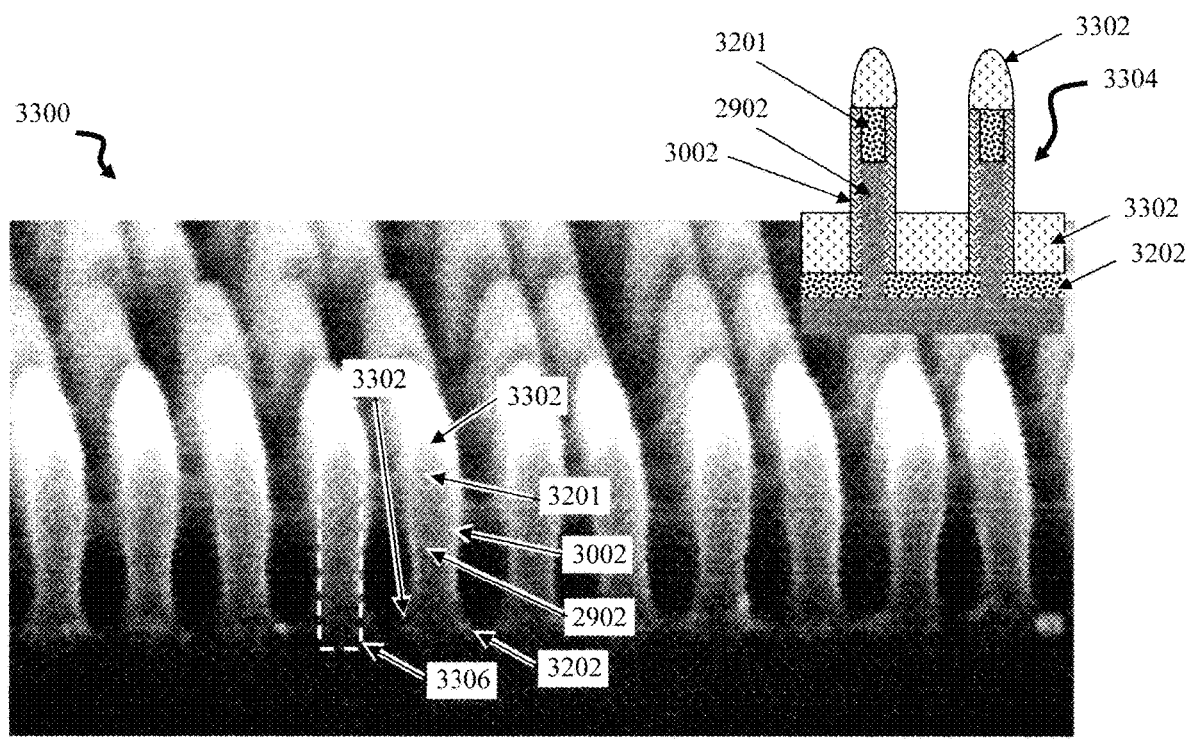
FIG. 33 is a three-dimensional image of a monolayer of a second (e.g., Si-containing) brush material having been grafted to the fin hardmasks and bottom spacers according to an embodiment of the present invention.

FIGS. 32 and 33 are images illustrating the two-brush approach to create grafting selectivity. Specifically, FIG. 32 is a three-dimensional image 3200 of the brush material 3002 having been grafted to the fins 2902 and fin hardmasks 3201 (above bottom spacers 3202) and etched. Inset 3204 illustrates a stage of the above-described process to which image 3200 corresponds. By way of example only, image 3200 is exemplary of the structure described in accordance with the description of FIG. 7 above.

FIG. 33 is a three-dimensional image 3300 of a monolayer of a second (e.g., Si-containing) brush material 3302 having been grafted to the fin hardmasks 3201 and bottom spacers 3202. Inset 3304 illustrates a stage of the above-described process to which image 3300 corresponds. By way of example only, image 3300 is exemplary of the structure described in accordance with the description of FIG. 8 above. Comparison of box 3206 (FIG. 32) and box 3306 (FIG. 33) indicates that the fin CD does not change considerably while the (e.g., about a 10 nm thick) second brush material 3302 is formed at the base of the fins 2902. If the second brush material 3302 were to graft onto the sidewalls of the fins 2902, then a much apparent fin CD change would be observed. Thus, it is evident that the fins sidewalls are protected and surface selectivity is created.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A vertical field-effect transistor (VFET) device, comprising:
    fins patterned in a substrate;
    bottom source and drains at a base of the fins;
    bottom spacers disposed on the bottom source and drains;
    a cladding layer disposed alongside opposite sidewalls of the fins;
    gates disposed along the opposite sidewalls of the fins in between the bottom spacers and the cladding layer, wherein the gates have a gate length set by a distance between the bottom spacers and the cladding layer;
    an encapsulation layer disposed over the cladding layer and the gates;
    top spacers disposed above the cladding layer; and
    top source and drains disposed above the top spacers.

2. The VFET device of claim 1, wherein the encapsulation layer comprises a material selected from the group consisting of: silicon nitride (SiN), silicon boron carbon nitride (SiBCN), silicon oxycarbon nitride (SiOCN), silicon carbon nitride (SiCN), and combinations thereof.

3. The VFET device of claim 1, wherein the encapsulation layer has a thickness of from about 2 nm to about 3 nm.

4. The VFET device of claim 1, further comprising:
    an insulator disposed over the encapsulation layer and surrounding the fins.

5. The VFET device of claim 4, wherein the insulator comprises a material selected from the group consisting of: silicon dioxide ($SiO_2$), silicon carbon oxide (SiCO), and combinations thereof.

6. The VFET device of claim 1, wherein the gates comprise:
    a gate dielectric disposed on the opposite sidewalls of the fins in between the bottom spacers and the cladding layer; and
    a gate conductor disposed on the gate dielectric.

7. The VFET device of claim 6, wherein the gate dielectric comprises a high-K gate dielectric selected from the group consisting of: hafnium oxide ($HfO_2$), lanthanum oxide ($La_2O_3$), and combinations thereof.

8. The VFET device of claim 6, wherein the gate dielectric has a thickness of from about 0.5 nm to about 2 nm.

9. The VFET device of claim 6, wherein the gate conductor comprises a workfunction setting metal selected from the group consisting of: titanium nitride (TiN), tantalum nitride (TaN), aluminum (Al)-containing alloys, titanium aluminide (TiAl), titanium aluminum nitride (TiAlN), titanium aluminum carbide (TiAlC), tantalum aluminide (TaAl), tantalum aluminum nitride (TaAlN), tantalum aluminum carbide (TaAlC), tungsten (W), and combinations thereof.

10. The VFET device of claim 6, wherein the gate conductor has a thickness of from about 4 nm to about 6 nm.

11. The VFET device of claim 1, wherein the cladding layer comprises a material selected from the group consisting of: SiN, SiBCN, SiOCN, SiCN, and combinations thereof.

12. The VFET device of claim 1, wherein the cladding layer has a thickness of from about 5 nm to about 8 nm.

13. A VFET device, comprising:
    fins patterned in a substrate;

bottom source and drains at a base of the fins;
bottom spacers disposed on the bottom source and drains;
a cladding layer disposed alongside opposite sidewalls of the fins;
gates disposed along the opposite sidewalls of the fins in between the bottom spacers and the cladding layer, wherein the gates have a gate length set by a distance between the bottom spacers and the cladding layer;
an encapsulation layer disposed over the cladding layer and the gates;
top spacers disposed above the cladding layer; and
top source and drains disposed above the top spacers.

14. The VFET device of claim 13, wherein the encapsulation layer comprises a material selected from the group consisting of: SiN, SiBCN, SiOCN, SiCN, and combinations thereof.

15. The VFET device of claim 13, wherein the encapsulation layer has a thickness of from about 2 nm to about 3 nm.

16. The VFET device of claim 13, wherein the gates comprise:
   a gate dielectric disposed on the opposite sidewalls of the fins in between the bottom spacers and the cladding layer; and
   a gate conductor disposed on the gate dielectric.

17. The VFET device of claim 16, wherein the gate dielectric comprises a high-K gate dielectric selected from the group consisting of: $HfO_2$, $La_2O_3$, and combinations thereof.

18. The VFET device of claim 16, wherein the gate conductor comprises a workfunction setting metal selected from the group consisting of: TiN, TaN, Al-containing alloys, TiA, TiAlN, TiAlC, TaAl, TaAlN, TaAlC, W, and combinations thereof.

19. The VFET device of claim 13, wherein the cladding layer comprises a material selected from the group consisting of: SiN, SiBCN, SiOCN, SiCN, and combinations thereof.

* * * * *